US012765362B2

(12) United States Patent
Jeon et al.

(10) Patent No.: US 12,765,362 B2
(45) Date of Patent: Oct. 13, 2026

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Wooyong Jeon, Suwon-si (KR); Moorym Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 762 days.

(21) Appl. No.: 18/121,456

(22) Filed: Mar. 14, 2023

(65) Prior Publication Data

US 2023/0361033 A1 Nov. 9, 2023

(30) Foreign Application Priority Data

May 9, 2022 (KR) ........................ 10-2022-0056778

(51) Int. Cl.
*H10W 20/41* (2026.01)
*H10B 41/27* (2023.01)
(Continued)

(52) U.S. Cl.
CPC .......... *H10W 20/435* (2026.01); *H10B 41/27* (2023.02); *H10B 41/35* (2023.02);
(Continued)

(58) Field of Classification Search
CPC .... H10W 20/435; H10W 20/42; H10B 43/35; H10B 41/35; H10B 41/40; H10B 43/40; H10B 41/27; H10B 43/27
See application file for complete search history.

(56) References Cited

U.S. PATENT DOCUMENTS

| | | | |
|---|---|---|---|
| 9,929,103 | B2 | 3/2018 | Segawa |
| 10,199,326 | B1 | 2/2019 | Ohsaki |

(Continued)

FOREIGN PATENT DOCUMENTS

| | | | |
|---|---|---|---|
| CN | 112204742 | A | 1/2021 |
| CN | 113725225 | A | 11/2021 |

(Continued)

OTHER PUBLICATIONS

Communication dated Nov. 19, 2025 issued by the Korean Intellectual Property Office in Korean Patent Application No. 10-2022-0056778.

(Continued)

*Primary Examiner* — Richard A Booth
(74) *Attorney, Agent, or Firm* — Sughrue Mion, PLLC

(57) ABSTRACT

A semiconductor device includes a substrate including a first region and a second region; insulating patterns in the substrate; gate electrodes provided below the substrate and spaced apart from each other in a first direction that is perpendicular to a lower surface of the substrate, the gate electrodes including pad regions arranged in a step shape below the second region; gate contact plugs passing through the pad regions of the gate electrodes, extending in the first direction, and vertically overlapping the insulating patterns; and a peripheral contact plug provided in an outer area of the substrate and extending from a level lower than a level of a lowermost gate electrode of the gate electrodes to a level higher than the lower surface of the substrate; and conductive patterns including a first conductive pattern provided on and connected to the peripheral contact plug, and second conductive patterns provided on and connected to the substrate.

20 Claims, 29 Drawing Sheets

(51) Int. Cl.

| | |
|---|---|
| ***H10B 41/35*** | (2023.01) |
| ***H10B 41/40*** | (2023.01) |
| ***H10B 43/27*** | (2023.01) |
| ***H10B 43/35*** | (2023.01) |
| ***H10B 43/40*** | (2023.01) |
| ***H10W 20/42*** | (2026.01) |

(52) U.S. Cl.

CPC ............. *H10B 41/40* (2023.02); *H10B 43/27* (2023.02); *H10B 43/35* (2023.02); *H10B 43/40* (2023.02); *H10W 20/42* (2026.01)

(56) References Cited

U.S. PATENT DOCUMENTS

| | | | | |
|---|---|---|---|---|
| 10,804,194 | B2 * | 10/2020 | Zhang ................. | H10W 20/023 |
| 10,903,236 | B2 | 1/2021 | Choi et al. | |
| 11,087,844 | B2 | 8/2021 | Kim et al. | |
| 2020/0388624 | A1 | 12/2020 | Baek | |
| 2021/0035965 | A1 | 2/2021 | Mizutani et al. | |
| 2021/0082950 | A1 | 3/2021 | Yoshimizu | |
| 2021/0134821 | A1 | 5/2021 | Choi | |
| 2021/0384218 | A1 | 12/2021 | Baek | |
| 2021/0407968 | A1 * | 12/2021 | Kim ...................... | H10W 90/00 |
| 2022/0139831 | A1 | 5/2022 | Kim et al. | |
| 2022/0399369 | A1 * | 12/2022 | Son ........................ | H10B 43/10 |
| 2024/0422976 | A1 * | 12/2024 | Kim ....................... | H10B 41/27 |

FOREIGN PATENT DOCUMENTS

| | | | |
|---|---|---|---|
| KR | 10 2021 0083429 | A | 7/2021 |
| KR | 10 2022 0000534 | A | 1/2022 |
| KR | 10 2022 0049701 | A | 4/2022 |
| KR | 10-2022-0053733 | A | 5/2022 |
| WO | 2022041103 | A1 | 3/2022 |

OTHER PUBLICATIONS

Communication dated Sep. 9, 2026 issued by the Korean Ministry of Intellectual Property in Korean Application No. 10-2022-0056778.

* cited by examiner

SEMICONDUCTOR DEVICES AND DATA STORAGE SYSTEMS INCLUDING THE SAME

CROSS-REFERENCE TO RELATED APPLICATION(S)

This application claims priority under 35 U.S.C. 119(a) to Korean Patent Application No. 10-2022-0056778 filed on May 9, 2022 in the Korean Intellectual Property Office, the disclosure of which is incorporated by reference herein in its entirety.

BACKGROUND

The present disclosure relates to a semiconductor device and a data storage system including the same.

In data storage systems requiring data storage, semiconductor devices capable of storing high-capacity data are in demand. Accordingly, a method for increasing the data storage capacity of a semiconductor device is being researched. For example, for increasing the data storage capacity of a semiconductor device, a semiconductor device including three-dimensionally arranged memory cells, instead of two-dimensionally arranged memory cells, has been proposed.

SUMMARY

One or more example embodiments provide a semiconductor device which may have improved electrical characteristics and reliability.

One or more example embodiments provide a data storage system including a semiconductor device with may have improved electrical characteristics and reliability.

Additional aspects will be set forth in part in the description which follows and, in part, will be apparent from the description, or may be learned by practice of the presented embodiments.

According to an example embodiment, a semiconductor device includes: a first semiconductor structure including a first substrate, circuit elements provided on the first substrate, and a lower interconnection structure connected to the circuit elements; and a second semiconductor structure provided on the first semiconductor structure and connected to the first semiconductor structure, wherein the second semiconductor structure includes: a second substrate including a first region and a second region; insulating patterns provided in the second substrate; gate electrodes provided between the second substrate and the first semiconductor structure and spaced apart from each other in a first direction that is perpendicular to a lower surface of the second substrate; a channel structure provided below the first region of the second substrate, penetrating through the gate electrodes and extending in the first direction, the channel structure including a channel layer; gate contact plugs passing through the gate electrodes, extending in the first direction, extending into the insulating patterns respectively, and spaced apart from the second substrate by the insulating patterns; and a source contact plug connected to the second substrate and extending from a level lower than a lowermost gate electrode closest to the first semiconductor structure, among the gate electrodes, to at least an inside of the second substrate.

According to an aspect of an example embodiment, a semiconductor device includes: a substrate including a first region and a second region; insulating patterns in the substrate; gate electrodes provided below the substrate and spaced apart from each other in a first direction that is perpendicular to a lower surface of the substrate, the gate electrodes including pad regions arranged in a step shape below the second region; gate contact plugs passing through the pad regions of the gate electrodes, extending in the first direction, and vertically overlapping the insulating patterns; and a peripheral contact plug provided in an outer area of the substrate and extending from a level lower than a level of a lowermost gate electrode of the gate electrodes to a level higher than the lower surface of the substrate; and conductive patterns including a first conductive pattern provided on and connected to the peripheral contact plug, and second conductive patterns provided on and connected to the substrate.

According to an aspect of an example embodiment, a data storage system includes: a first semiconductor structure including a first substrate, circuit elements provided on the first substrate, and a lower interconnection structure connected to the circuit elements; a semiconductor storage device including a second semiconductor structure provided on the first semiconductor structure and connected to the first semiconductor structure, and an input/output pad connected to the circuit elements; and a controller connected to the semiconductor storage device through the input/output pad, and configured to control the semiconductor storage device, wherein the second semiconductor structure includes: a second substrate including a first region and a second region; insulating patterns provided in the second substrate; gate electrodes provided between the second substrate and the first semiconductor structure and spaced apart from each other in a first direction that is perpendicular to a lower surface of the second substrate; a channel structure provided below the first region of the second substrate, penetrating through the gate electrodes and extending in the first direction, the channel structure including a channel layer; gate contact plugs passing through the gate electrodes, extending in the first direction, extending into the insulating patterns respectively, and spaced apart from the second substrate by the insulating patterns; and a source contact plug connected to the second substrate and extending from a level lower than a level of a lowermost gate electrode closest to the first semiconductor structure, among the gate electrodes, to an inside of the second substrate.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
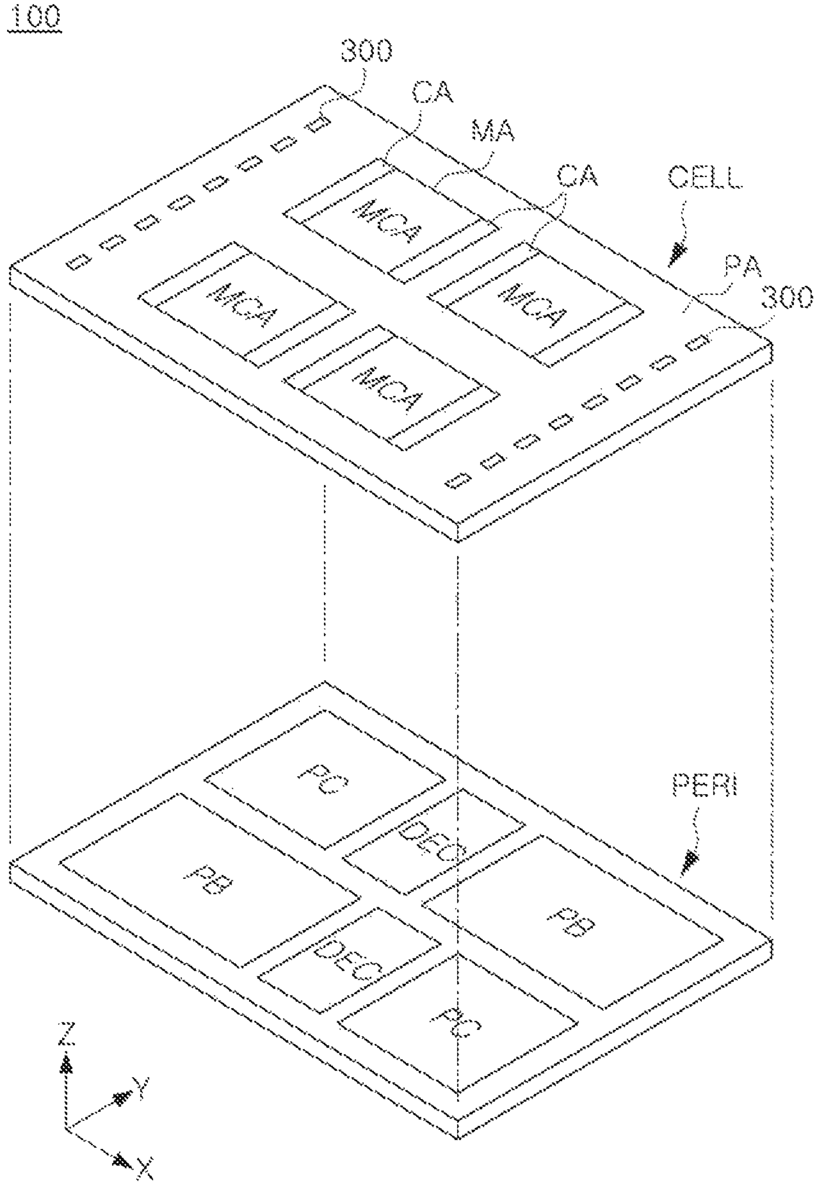
FIG. 1 is a diagram of a semiconductor device according to an example embodiment.

Hereinafter, example embodiments will be described with reference to the accompanying drawings. Terms such as 'on', 'upper portion', 'upper surface', 'top', 'below', 'lower portion', 'lower surface', 'bottom', 'side', 'side surface, and the like may be understood as referring to the drawings, except the case indicated by reference numerals and designated separately.

FIG. 1 is a diagram of a semiconductor device according to an example embodiment.

Referring to FIG. 1, a semiconductor device 100 according to example embodiments may include a peripheral circuit region PERI and a memory cell region CELL stacked in the vertical direction Z. The peripheral circuit region PERI and the memory cell region CELL may be bonded to and combined with each other. The memory cell region CELL may include a memory cell array region MCA, a connection area CA adjacent to the memory cell array region MCA, and an outer area PA disposed outside the memory cell array region MCA and the connection area CA. An input/output pad 300 may be disposed on the outer area PA. A memory cell structure including the memory cell array region MCA and the connection area CA may be provided as a plurality of memory cell structures.

The peripheral circuit region PERI may include a row decoder DEC, a page buffer PB, and other peripheral circuits PC. In the peripheral circuit region PERI, the row decoder DEC may decode the input address to generate and transmit driving signals of the word line. The page buffer PB may be connected to the memory cell array region MCA through bit lines to read information stored in the memory cells. The other peripheral circuits PC may be regions including control logic and voltage generators, and may include, for example, latch circuits, cache circuits, and/or sense amplifiers. The peripheral circuit region PERI may further include a separate pad region, and in this case, the pad region may include an electrostatic discharge (ESD) device or a data input/output circuit. The ESD device or data input/output circuit of the pad region may be electrically connected to the input/output pad 300 of the outer area PA. The various circuit regions DEC, PB, and PC in the peripheral circuit region PERI may be disposed in various shapes.

Figure 2A:
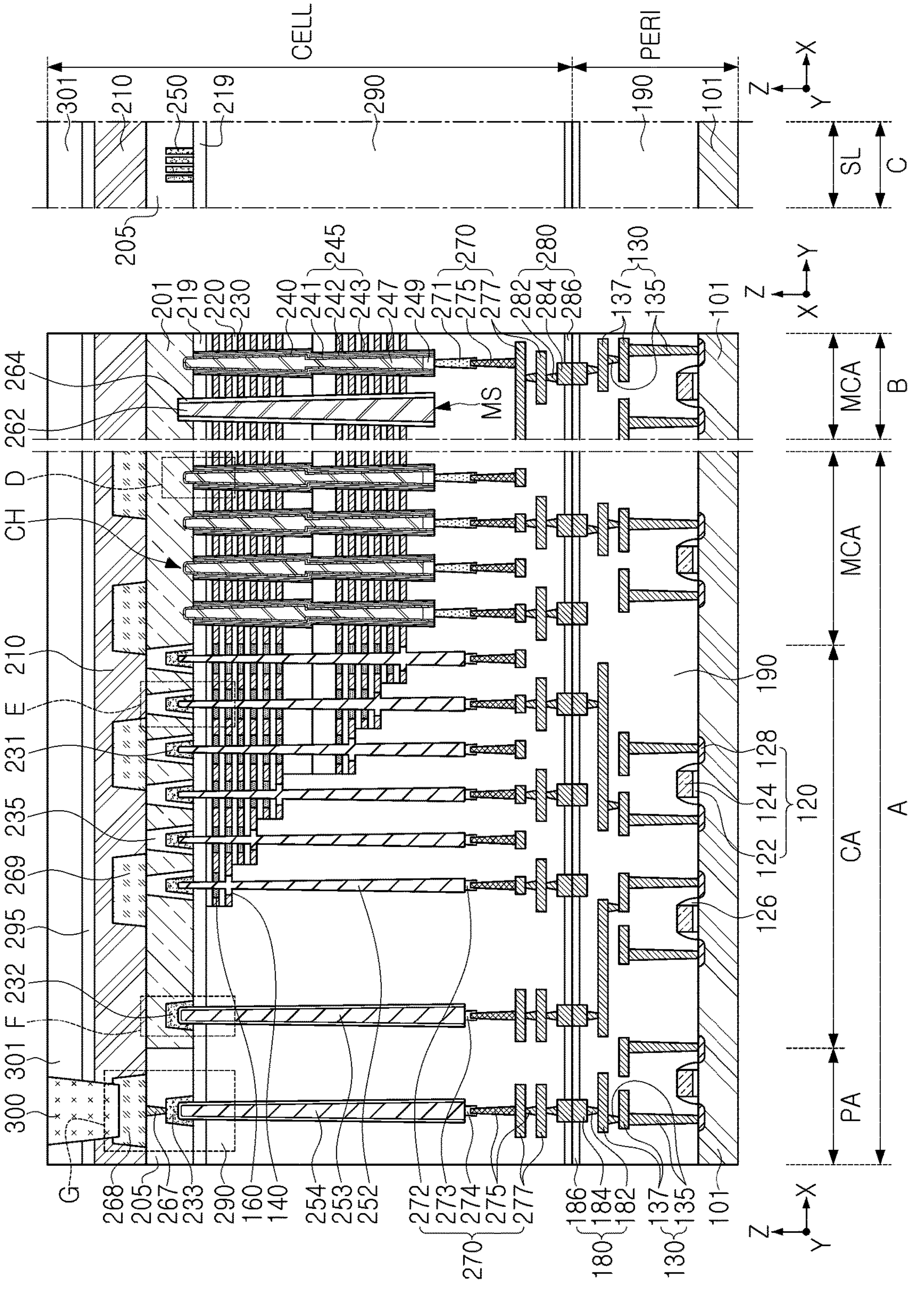
FIG. 2A is a cross-sectional view of a semiconductor device according to an example embodiment.

FIG. 2A is a cross-sectional view of a semiconductor device according to an example embodiment. FIGS. 2B, 2C, 2D, and 2E are diagrams of a semiconductor device according to an example embodiment. Hereinafter, an example of the semiconductor device 100 will be described with reference to FIGS. 2A to 2E. FIG. 2A schematically illustrates that an area indicated by 'A' is a portion of the memory cell array region MCA, the connection area CA, and a portion of the outer area PA, in a cross section of the semiconductor device 100 in the X-direction, and illustrates that an area denoted by 'B' is represented as a portion of the memory cell array region MCA in a cross section of the semiconductor device 100 in the Y direction.

Figure 2B:
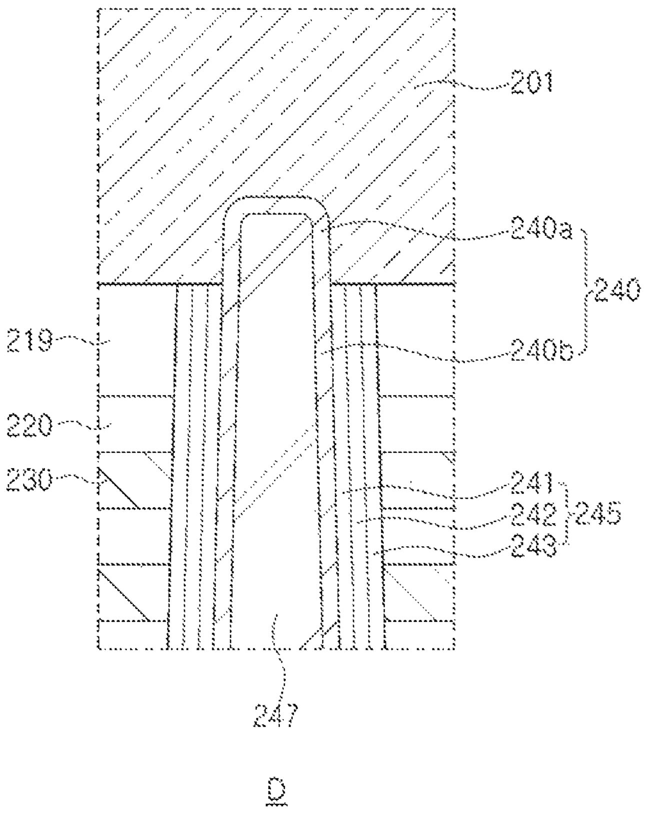
FIGS. 2B, 2C, 2D, and 2E are diagrams of a semiconductor device according to an example embodiment.
Figure 2C:
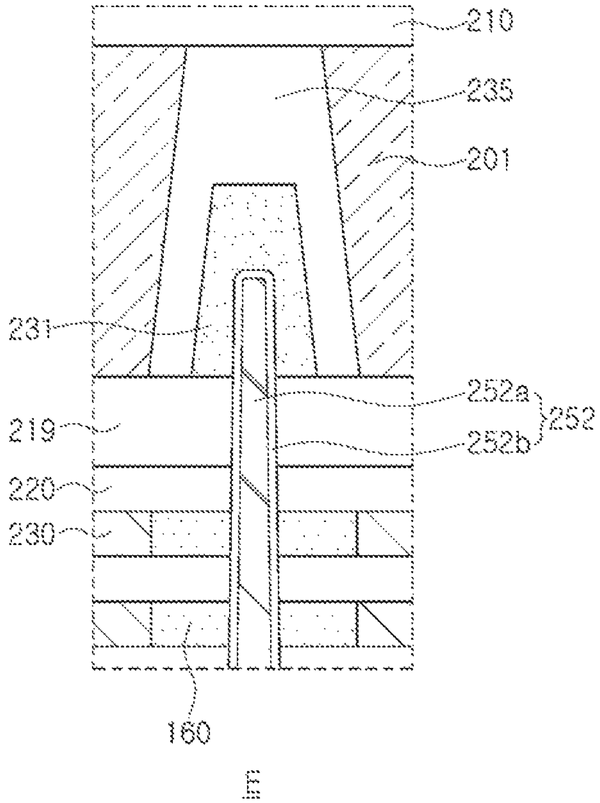
Figure 2D:
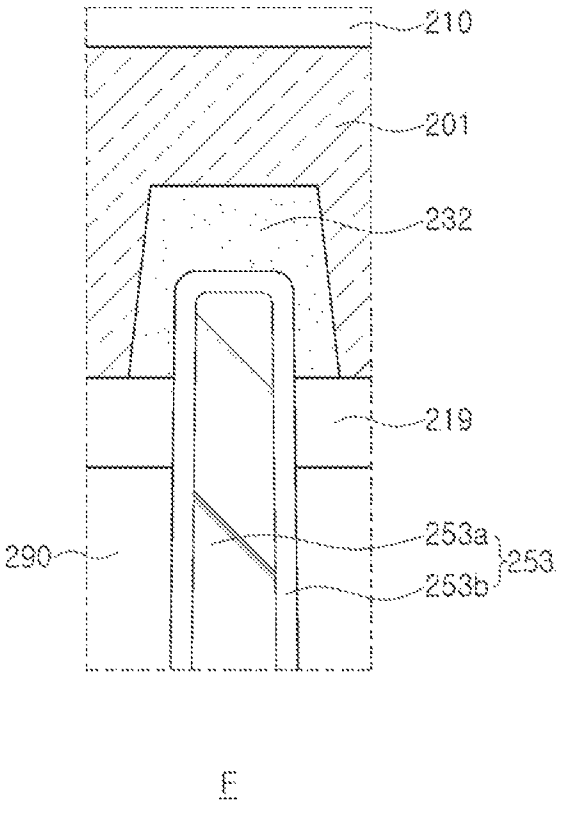
Figure 2E:
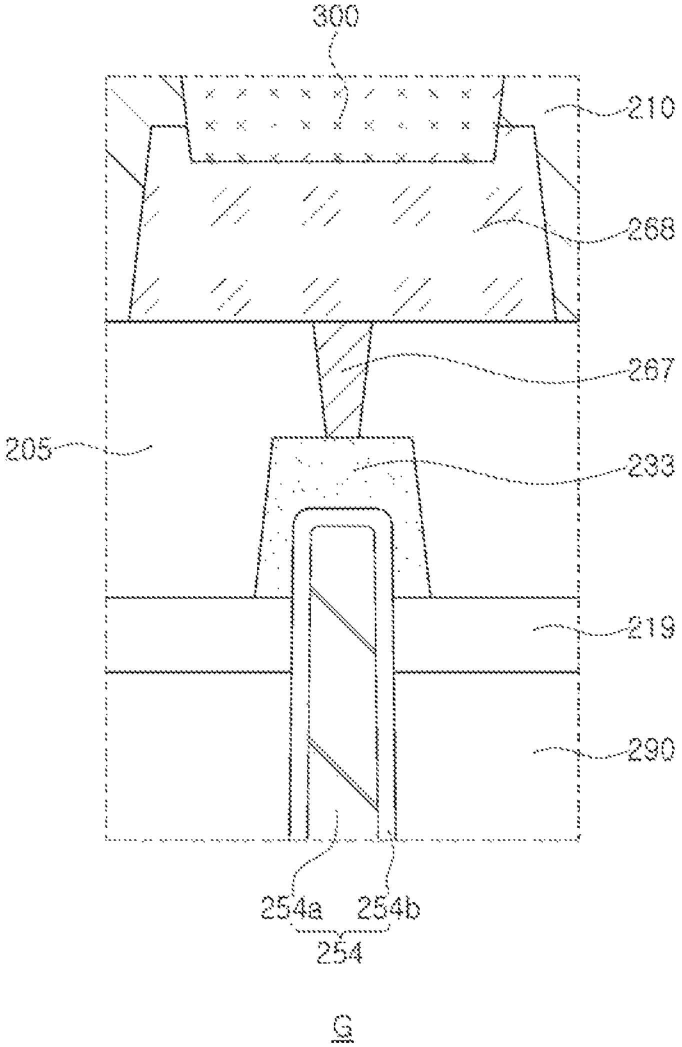

In FIG. 2A, a region denoted by 'C' schematically illustrates a cross-sectional shape obtained by partially cutting the external portion of the semiconductor device 100 in the X direction in the operation of forming the semiconductor device 100. FIGS. 2B to 2E are partially enlarged views of a semiconductor device according to example embodiments. FIG. 2B is an enlarged view of area 'D' of FIG. 2A, FIG. 2C is an enlarged view of area 'E' of FIG. 2A, FIG. 2D is an enlarged view of area 'F' of FIG. 2A, and FIG. 2E is an enlarged view of area G' of FIG. 2A.

Referring to FIGS. 2A to 2E, the semiconductor device 100 may include the peripheral circuit region PERI and the memory cell region CELL. The memory cell region CELL may be disposed on the peripheral circuit region PERI. The peripheral circuit region PERI and the memory cell region CELL may be bonded to each other through bonding structures 180 and 280. The peripheral circuit region PERI may be referred to as a first semiconductor structure, and the memory cell region CELL may be referred to as a second semiconductor structure.

The peripheral circuit region PERI may include a first substrate 101, circuit elements 120 on the first substrate 101, a lower interconnection structure 130, a lower bonding structure 180, and a lower capping layer 190.

The first substrate 101 may include a semiconductor material, for example, a group IV semiconductor, a group III-V compound semiconductor, or a group II-VI compound semiconductor. The first substrate 101 may be provided as a bulk wafer or an epitaxial layer. An active region may be defined in the first substrate 101 by device isolation layers. Source/drain regions 128 including impurities may be disposed in a portion of the active region.

The circuit elements 120 may include transistors. Each of the circuit elements 120 may include a circuit gate dielectric layer 122, a circuit gate electrode 124, and a source/drain region 128. The source/drain regions 128 including impurities may be disposed in the first substrate 101 at both sides of the circuit gate electrode 124. Spacer layers 126 may be disposed on both sides of the circuit gate electrode 124. The circuit gate dielectric layer 122 may include silicon oxide, silicon nitride, or a high-k material. The circuit gate electrode 124 may include at least one of titanium nitride (TiN), tantalum nitride (TaN), and tungsten nitride (WN), titanium silicon nitride (TiSiN), tantalum silicon nitride (TaSiN), and tungsten silicon nitride (WSiN), tungsten (W), copper (Cu), aluminum (Al), molybdenum (Mo), and ruthenium (Ru). In an example embodiment, the circuit gate electrode 124 may include two or more multilayers.

The lower interconnection structure 130 may be electrically connected to the circuit gate electrodes 124 and the source/drain regions 128 of the circuit elements 120. The lower interconnection structure 130 may include lower contact plugs 135 having a cylindrical or truncated cone shape, and lower interconnection lines 137 having at least one region in a line shape. Some of the lower contact plugs 135 may be connected to the source/drain regions 128, and other portions of the lower contact plugs 135 may be connected to the circuit gate electrodes 124. The lower contact plugs 135 may electrically connect the lower interconnection lines 137 disposed at different levels from the upper surface of the first substrate 101 to each other. The lower interconnection structure 130 may include a conductive material, for example, tungsten (W), copper (Cu), aluminum (Al), or the like, and each of the components further include a diffusion barrier including at least one of titanium (Ti), titanium nitride (TiN), tantalum (Ta), tantalum nitride (TaN), and tungsten nitride (WN). In example embodiments, the number of layers and arrangement of the lower contact plugs 135 and the lower interconnection lines 137 constituting the lower interconnection structure 130 may be variously changed.

The lower bonding structure 180 may be connected to the lower interconnection structure 130. The lower bonding structure 180 may include a lower bonding via 182, a lower bonding pad 184, and a lower bonding insulating layer 186. The lower bonding via 182 may be connected to the lower interconnection structure 130. The lower bonding pad 184 may be connected to the lower bonding via 182. The lower bonding via 182 and the lower bonding pad 184 may include a conductive material, for example, tungsten (W), copper (Cu), aluminum (Al), or the like, and may further respectively include a diffusion barrier. The lower bonding insulating layer 186 may also function as a diffusion barrier of the lower bonding pad 184, and may include at least one of SiCN, SiO, SiN, SiOC, SiON, and SiOCN. The lower bonding insulating layer 186 may have a thickness less than a thickness of the lower bonding pad 184, but the present disclosure is not limited thereto. The lower bonding structure 180 may be joined or connected by direct contact with the upper bonding structure 280 by hybrid bonding. For example, the lower bonding pad 184 may contact the upper bonding pad 284 and may be combined therewith by copper (Cu)-copper bonding, and the lower bonding insulating layer 186 may contact the upper bonding insulating layer 286 and may be combined therewith by dielectric-to-dielectric bonding. The lower bonding structure 180 may provide an electrical connection path between the peripheral circuit region PERI and the memory cell region CELL together with the upper bonding structure 280.

The lower capping layer 190 may be disposed on the first substrate 101 to cover the circuit elements 120 and the lower interconnection structure 130. The lower capping layer 190 may include a plurality of insulating layers. The lower capping layer 190 may include an insulating material, for example, silicon oxide, silicon nitride, silicon oxynitride, or silicon oxycarbide.

The memory cell region CELL may include a second substrate 201, insulating patterns 235 in the second substrate 201, gate electrodes 230 stacked below the second substrate 201, a separation region MS extending while penetrating through the stack structure of the gate electrodes 230, channel structures CH disposed to penetrate through the stack structure, contact plugs 252, 253 and 254 for electrical connection with the peripheral circuit region PERI, first conductive pads 231 respectively disposed in the insulating patterns 235 and respectively electrically connected to gate contact plugs 252 among the contact plugs 252, 253 and 254 by the second substrate 201 and the insulating patterns 235, a second conductive pad 232 on the second substrate 201 and contacting an upper portion of a source contact plug 253 among the contact plugs 252, 253 and 254, a third conductive pad 233 on the outer area PA of the second substrate 201 and contacting an upper portion of the peripheral contact plug 254 among the contact plugs 252, 253 and 254, an upper interconnection structure 270 below the stack structure, and an upper bonding structure 280 connected to the upper interconnection structure 270. The memory cell region CELL may further include an outer insulating layer 205 contacting the outer end of the second substrate 201, interlayer insulating layers 220 disposed below the second substrate 201 and alternately stacked with the gate electrodes 230, a peripheral contact via 267 contacting an upper surface of the third conductive pad 233, an upper capping layer 290 covering the stack structure, upper insulating layers 210 and 295 on the second substrate 201, conductive patterns 268 and 269 on the second substrate 201, a protective layer 301 on the upper insulating layers 210 and 295, and an input/output pad 300 on the peripheral contact via 267.

In the memory cell region CELL, the memory cell array region MCA, the connection area CA, and the outer area PA may be defined based on, for example, the second substrate 201 and surrounding components thereof.

As illustrated in FIG. 2A, the memory cell array region MCA may be a region in which the gate electrodes 230 are stacked while being spaced apart from each other in a vertical direction, for example, the Z direction, and the channel structures CH are disposed. As illustrated in FIG. 2A, the connection area CA may be an area in which the gate electrodes 230 extend to have different lengths to provide contact pads for electrically connecting the memory cells to the peripheral circuit region PERI. The connection area CA may be an area in which the source contact plug 253 is disposed. The memory cell array region MCA and the connection area CA may be understood as areas including both the areas below and above the second substrate 201, including the second substrate 201.

As illustrated in FIG. 2A, the outer area PA may refer to an area from the outer end of the second substrate 201 to the edge of the semiconductor device 100, and may be an area in which the input/output pad 300, the first conductive pattern 268, the peripheral contact via 267, the third conductive pad 233, the outer insulating layer 205, and the peripheral contact plug 254 are disposed. The outer area PA may be an area other than the area in which the memory cell array region MCA and the connection area CA are disposed in the memory cell region CELL. The outer area PA may indicate an area in which the outer insulating layer 205 disposed outside the second substrate 201 is disposed, or may refer to a region including the outer insulating layer 205 and both the region and the region below and above the outer insulating layer 205.

An alignment key 250 may be disposed in an alignment key region SL. A thickness of the alignment key 250 in the vertical direction Z may be less than a thickness of the second substrate 201. The upper surface of the alignment key 250 may be disposed on a level lower than the upper surface of the second substrate 201. At least a portion of the alignment key 250 may be disposed at substantially the same level as a portion of the second substrate 201.

The second substrate 201 may have a first region and a second region. The first region may be the second substrate 201 in the memory cell array region MCA, and the second region may be an area in which the insulating patterns 235 in the second substrate 201 in the connection area CA are disposed. The second substrate 201 may cover an upper surface and a side surface of each of the insulating patterns 235. The second substrate 201 may include a semiconductor material, for example, a group IV semiconductor, a group III-V compound semiconductor, or a group II-VI compound semiconductor. For example, the group IV semiconductor may include silicon (Si), germanium (Ge), or silicon-germanium (SiGe). The second substrate 201 may function as a common source line of the semiconductor device 100. For example, the second substrate 201 may include a doped polysilicon layer having an N-type conductivity. The channel layer 240 may contact the second substrate 201.

The outer insulating layer 205 may be disposed to contact the outer side surface of the second substrate 201. The lower surface of the outer insulating layer 205 may be substantially coplanar with the lower surface of the second substrate 201, but the present disclosure is not limited thereto. The outer insulating layer 205 may be formed of an insulating material, and may include, for example, silicon oxide, silicon oxynitride, or silicon nitride.

The insulating patterns 235 may be disposed in the second substrate 201 on the connection area CA. The insulating patterns 235 may penetrate through the second substrate 201, and side surfaces of the insulating patterns 235 may contact the second substrate 201. The insulating patterns 235 may cover upper surfaces and side surfaces of the conductive pads 231, 232, and 233, respectively. Each of the gate contact plugs 252 may be spaced apart from the second substrate 201 by each of the insulating patterns 235. The level of the upper surface of each of the insulating patterns 235 may be substantially coplanar with the level of the upper surface of the second substrate 201, but the present disclosure is not limited thereto. The insulating patterns 235 may be formed of an insulating material, and may include, for example, silicon oxide, silicon oxynitride, or silicon nitride.

The conductive pads 231, 232, and 233 may each have a trapezoidal shape and may have a width narrowed toward the top. The conductive pads 231, 232, and 233 may include a first conductive pad 231, a second conductive pad 232, and a third conductive pad 233. The conductive pads 231, 232, and 233 may be disposed in the insulating patterns 235. The first conductive pads 231, the second conductive pad 232, and the third conductive pad 233 may be disposed to be spaced apart from each other. Each of the first conductive pads 231 may penetrate a portion of each of the insulating patterns 235 in the second substrate 201. The second conductive pad 232 may penetrate through the second substrate 201, and a side surface of the second conductive pad 232 may contact the second substrate 201. The third conductive pad 233 may penetrate a portion of the outer insulating layer 205 and may contact the peripheral contact via 267. The level of the upper surface of each of the conductive pads 231, 232, and 233 may be lower than the level of the upper surface of the second substrate 201. A thickness of the third conductive pad 233 among the conductive pads 231, 232, and 233 is less than a thickness of the second substrate 201, and at least a portion of the third conductive pad 233 may be disposed at substantially the same level as a portion of the second substrate 201. A horizontal width of the first conductive pad 231 among the conductive pads 231, 232, and 233 may be less than a horizontal width of the third conductive pad 233. The conductive pads 231, 232, and 233 may include a conductive material, for example, a metal material such as tungsten (W).

The gate electrodes 230 may be vertically spaced apart and stacked below the second substrate 201 to form a stack structure. The gate electrodes 230 may be disposed between the second substrate 201 and the upper interconnection structure 270. The gate electrodes 230 may include electrodes forming a ground select transistor, memory cells, and a string select transistor sequentially from the second substrate 201. The number of gate electrodes 230 constituting the memory cells may be determined according to the storage capacity of the semiconductor device 100. According to an example embodiment, the number of gate electrodes 230 constituting the string select transistor and the ground select transistor may be one, or two or more, respectively, and may have the same or different structure as the gate electrodes 230 of the memory cells. The gate electrodes 230 may further include a gate electrode 230 which is disposed below the gate electrode 230 constituting the string selection transistor and above the gate electrode 230 constituting the ground selection transistor, and which constitutes an erase transistor used for an erase operation using a gate induced drain leakage (GIDL) phenomenon.

The gate electrodes 230 may be stacked to be spaced apart from each other in the vertical direction in the memory cell array region MCA, and may extend from the memory cell array region MCA to the connection area CA at different lengths to have a stepped structure in the form of a step. As illustrated in FIG. 2A, the gate electrodes 230 may have a stepped structure in the X direction and may also be disposed to have a stepped structure in the Y direction. Due to the stepped structure, the gate electrodes 230 may form a step shape in which the upper gate electrode extends longer than the lower gate electrode and provide end portions that are exposed from the interlayer insulating layers 220 toward the first substrate 101. In example embodiments, at the end portions, the gate electrodes 230 may have an increased thickness. Some electrodes constituting the string select transistor among the gate electrodes 230 may be separated by an isolation insulating layer extending in the X direction.

The gate electrodes 230 may form a lower gate stack group and an upper gate stack group on the lower gate stack group. The interlayer insulating layer 220 disposed between the lower gate stack group and the upper gate stack group may have a relatively thick thickness, but the present disclosure is not limited thereto. In FIG. 2A, it is illustrated that two stack groups of the gate electrodes 230 are disposed vertically, but the present disclosure is not limited thereto. For example, the gate electrodes 230 may form one stack group or a plurality of stack groups.

The gate electrodes 230 may include a metal material, for example, tungsten (W). In some embodiments, the gate electrodes 230 may include polycrystalline silicon or a metal silicide material. In example embodiments, the gate electrodes 230 may further include a diffusion barrier, and for example, the diffusion barrier may include tungsten nitride (WN), tantalum nitride (TaN), titanium nitride (TiN), or combinations thereof.

The interlayer insulating layers 220 may be disposed between the gate electrodes 230. Like the gate electrodes 230, the interlayer insulating layers 220 may be spaced apart from each other in a direction perpendicular to the lower surface of the second substrate 201 and may be disposed to extend in the X direction. The interlayer insulating layers 220 may include an insulating material such as silicon oxide or silicon nitride.

The separation region MS may be disposed to extend in the X-direction by penetrating through the gate electrodes 230 in the memory cell array region MCA and the connection area CA. The separation region MS may penetrate through the entire gate electrodes 230 stacked below the second substrate 201 to be connected to the second substrate 201. The separation region MS may have a shape in which a width decreases toward the second substrate 201 due to a high aspect ratio. The separation region MS may extend in the X direction to separate the gate electrodes 230 from each other in the Y direction. The separation regions MS may include a conductive layer 262 and an isolation insulating layer 264. The isolation insulating layer 264 may cover side surfaces of the conductive layer 262. The conductive layer 262 may be connected to the second substrate 201. The isolation insulating layer 264 may include an insulating material such as silicon oxide or silicon nitride, and the conductive layer 262 may include a conductive material, for example, tungsten (W), copper (Cu), aluminum (Al) or the like.

Each of the channel structures CH may form one memory cell string, and may be disposed to be spaced apart from each other while forming rows and columns in the memory cell array region MCA. The channel structures CH may be disposed to form a grid pattern in the X-Y plane or may be disposed in a zigzag shape in one direction. The channel structures CH may extend in the Z direction, may have a columnar shape, and may have inclined side surfaces that are narrower in width as they approach the second substrate 201 according to an aspect ratio.

Each of the channel structures CH may have a form in which lower and upper channel structures penetrating through the lower gate stack group and the upper gate stack group of the gate electrodes 230, respectively, are connected to each other, and may have a bent portion due to a difference or change in width in the connection region.

A channel layer 240 may be disposed in the channel structures CH. The channel layer 240 may be connected between the lower channel structure and the upper channel structure. The channel layer 240 may include a protruding portion 240*a* protruding into the second substrate 201 and a non-protruding portion 240*b* that does not protrude into the second substrate 201. The channel layer 240 may be formed in an annular shape surrounding a channel filling insulating layer 247 therein, but may have a columnar shape such as a cylinder or a prism without the channel filling insulating layer 247 according to an example embodiment. On the upper portion of the channel layer 240, the protruding portion 240*a* of the channel layer 240 may be connected to the second substrate 201. The channel layer 240 may include a semiconductor material such as polycrystalline silicon or single crystal silicon, and the semiconductor material may be an undoped material or a material containing p-type or n-type impurities.

Channel pads 249 may be disposed below the channel layer 240 in the channel structures CH. The channel pads 249 may be disposed to cover the lower surface of the channel filling insulating layer 247 and be electrically connected to the channel layer 240. The channel pads 249 may include, for example, doped polycrystalline silicon.

The gate dielectric layer 245 may be disposed between the gate electrodes 230 and the channel layer 240. The gate dielectric layer 245 may include a tunneling layer 241, a charge storage layer 242, and a blocking layer 243 sequentially stacked from the channel layer 240. The tunneling layer 241 may tunnel charges into the charge storage layer 242, and may include, for example, silicon oxide ($SiO_2$), silicon nitride ($Si_3N_4$), silicon oxynitride (SiON), or combinations thereof. The charge storage layer 242 may be a charge trap layer or a floating gate conductive layer. The blocking layer 243 may include silicon oxide ($SiO_2$), silicon nitride ($Si_3N_4$), silicon oxynitride (SiON), a high-k dielectric material, or combinations thereof. In example embodiments, at least a portion of the gate dielectric layer 245 may extend in a horizontal direction along the gate electrodes 230.

Each of the contact plugs 252, 253, and 254 may have a cylindrical or truncated cone shape, and may have a width narrower toward the top according to an aspect ratio. The contact plugs 252, 253, and 254 may penetrate a portion of the upper capping layer 290. The contact plugs 252, 253, and 254 may include a gate contact plug 252, a source contact plug 253, and a peripheral contact plug 254. The gate contact plug 252, the source contact plug 253, and the peripheral contact plug 254 may be disposed to be spaced apart from each other and respectively provided in plural. Each of the contact plugs 252, 253, and 254 may include a conductive layer and a barrier layer surrounding side surfaces and one end of the conductive layer. For example, as illustrated in FIGS. 2B to 2D, the contact plugs 252, 253, and 254 may include conductive layers 252*a*, 253*a*, 254*a* and barrier layers 252*b*, 253*b*, and 254*b*, respectively, and the barrier layers 252*b*, 253*b*, and 254*b* may surround upper surfaces and side surfaces of the conductive layers 252*a*, 253*a*, and 254*a*. The conductive layers 252*a*, 253*a*, and 254*a* may include a conductive material, for example, a metal material such as tungsten (W), copper (Cu), or aluminum (Al), and the barrier layers 252*b*, 253*b* and 254*b* may include at least one of, for example, titanium (Ti), titanium nitride (TiN), tantalum (Ta), tantalum nitride (TaN), tungsten nitride (WN), and tungsten carbon nitride (WCN).

The gate contact plugs 252 may be disposed in the connection area CA and may extend in a vertical direction, for example, a Z direction. The gate contact plugs 252 pass through the upper capping layer 290, the pad regions 140, and the gate contact plug insulating layers 160 thereon in the connection area CA, and may be disposed to be respectively connected to the ends or contact pads according to the step shape of the gate electrodes 230. The pad regions 140 of the gate electrodes 230 may be disposed below the second region of the second substrate 201. In detail, the gate contact plugs 252 may be electrically connected to the side surface of the pad region 140 of a lowermost gate electrode in the connection area CA. The gate contact plugs 252 may respectively pass through the gate electrodes 230, extend in the first direction Z, extend into the insulating patterns 235, and may be spaced apart from the second substrate 201 by the insulating patterns 235. The gate contact plugs 252 may vertically overlap the insulating patterns 235, and may respectively contact the first conductive pads 231 respectively disposed in the insulating patterns 235 and spaced apart from the second substrate 201 by the insulating patterns 235.

The source contact plug 253 may be spaced apart from the second substrate 201 on the outside of the second substrate 201 and may extend in a vertical direction, for example, a Z direction. In detail, the source contact plug 253 may extend, from a level lower than a lowest gate electrode based on the upper surface of the first substrate 101 among the gate electrodes 230, to at least a level higher than the lower surface of the second substrate 201. The source contact plug 253 may pass through the upper capping layer 290 and the substrate insulating layer 219 to be connected to the second conductive pad 232. For example, an upper surface of the source contact plug 253 may contact the second conductive pad 232. A lower surface of the source contact plug 253 may be positioned at a lower level than the lowest gate electrode among the gate electrodes 230 with respect to the upper surface of the first substrate 101. The lower surface of the source contact plug 253 may be connected to the upper interconnection structure 270. A width of an upper surface of the source contact plug 253 may be less than a width of a lower surface of the source contact plug 253. The source contact plug 253 may be formed in the same process step as the process of the peripheral contact plug 254, and may have the same or similar shape as the peripheral contact plug 254.

The peripheral contact plug 254 may be spaced apart from the second substrate 201 and the source contact plug 253, on the outside of the second substrate 201, and may extend in a vertical direction, for example, a Z-direction. In detail, in the outer area PA of the second substrate 201, the peripheral contact plug 154 may extend from a level lower than the lowest gate electrode among the gate electrodes 230 to at least a level higher than the lower surface of the second substrate 201. The peripheral contact plug 254 may pass through the outer insulating layer 205 and the substrate insulating layer 219 to be connected to the following third conductive pad 233. An upper surface of the peripheral contact plug 254 may contact the third conductive pad 233. The peripheral contact plug 254 may be connected to the upper interconnection structure 270. Based on the upper surface of the first substrate 101, the upper surface of the peripheral contact plug 254 and the upper surface of the source contact plug 253 may be positioned at substantially the same level.

When the source contact plug 253 is directly connected to the edge portion of the second substrate 201, the semiconductor material layer of the second substrate 201 may provide an electrical connection path from the edge portion of the second substrate 201 to the channel structure CH of the memory cell array region MCA. The electrical connection path may have a length from the edge portion of the second substrate 201 to the channel structure CH of the memory cell array region MCA. In this case, since the semiconductor material layer has a relatively higher electrical resistance than the metal material layer, noise generated by the resistance component of the second substrate 201 may interfere with the performance of an operation (e.g., a read operation) of the memory cell. For example, when a current flows to the common source line of the second substrate 201, the resistance component of the second substrate 201 may cause a voltage drop in the common source line, such that the read operation of the memory cell may not be properly performed. According to an example embodiment of the present disclosure, the source contact plug 253 may be directly connected to the second conductive pad 232 formed of a metal material to electrically connect the source contact plug 253 to the second substrate 201. The second conductive patterns 269 may be widely disposed on the upper surface of the second substrate 201 such that the metal material layer of the second conductive pattern 269 having a relatively low electrical resistance may provide an electrical connection path from the source contact plug 253 to the channel structure CH of the memory cell array region MCA. Accordingly, the length of the electrical connection path by the semiconductor material layer of the second substrate 201 having a relatively high electrical resistance may be reduced. In addition, since the resistance component of the common source line of the second substrate 201 may be reduced, noise generated by the common source line when the memory cell is operated may be reduced, and electrical characteristics and reliability of the semiconductor device may be improved.

The first conductive pattern 268 and the peripheral contact via 267 may be disposed on the peripheral contact plug 254. The first conductive pattern 268 may be spaced apart from the second conductive pattern 269 in the outer area PA. The peripheral contact via 267 may be electrically connected to the third conductive pad 233, on the third conductive pad 233. The first conductive pattern 268 may be electrically connected to the peripheral contact via 267, on the peripheral contact via 267. The first conductive pattern 268 may contact an upper surface of the peripheral contact via 267 and may be connected to the input/output pad 300. The width of the lower region of the peripheral contact via 267 may be less than the width of the upper region. The first conductive pattern 268 and the peripheral contact via 267 may include the same material as the second conductive pattern 269. According to an example embodiment, the peripheral contact via 267 may include aluminum (Al) or tungsten (W).

The upper interconnection structure 270 may electrically connect the gate electrodes 230, the channel structures CH, the second substrate 201, and the input/output pad 300 to the circuit elements 120. The upper interconnection structure 270 may include a channel contact plug 271, a gate contact stud 272, a source contact stud 273, a peripheral contact stud 274, an upper contact plug 275, and an upper interconnection line 277. The channel contact plug 271 may be connected to the channel pad 249 of the channel structure CH. The channel contact plug 271 may be electrically connected to the channel layer 240 through the channel pads 249 of the channel structures CH, in the memory cell array region MCA. The gate contact stud 272 may be connected to the gate contact plug 252. The source contact stud 273 may be connected to the source contact plug 253. The peripheral contact stud 274 may be connected to the peripheral contact plug 254. The upper contact plug 275 may have a cylindrical or truncated cone shape, and at least one region of the upper interconnection line 277 may have a line shape. The upper contact plugs 275 may be respectively connected to the channel contact plug 271, the gate contact stud 272, the source contact stud 273, and the peripheral contact stud 274. The upper interconnection line 277 may be connected to the upper contact plug 275. The upper interconnection structure 270 may include a conductive material, for example, tungsten (W), copper (Cu), aluminum (Al), or the like, and each of the components may further include a diffusion barrier including at least one of titanium (Ti), titanium nitride (TiN), tantalum (Ta), tantalum nitride (TaN), and tungsten nitride (WN). In example embodiments, the number and arrangement of the upper contact plugs 275 and the upper interconnection lines 277 constituting the upper bonding structure 280 may be variously changed.

The upper bonding structure 280 may be connected to the upper interconnection structure 270. The upper bonding structure 280 may include an upper bonding via 282, an upper bonding pad 284, and an upper bonding insulating layer 286. The upper bonding via 282 may be connected to the upper interconnection structure 270. The upper bonding pad 284 may be connected to the upper bonding via 282. The upper bonding via 282 and the upper bonding pad 284 may include a conductive material, for example, tungsten (W), copper (Cu), aluminum (Al), or the like, and respective components may further include a diffusion barrier. The upper bonding insulating layer 286 may also function as a diffusion barrier of the upper bonding pad 284, and may include at least one of SiCN, SiO, SiN, SiOC, SiON, and SiOCN. The upper bonding insulating layer 286 may have a thickness less than a thickness of the upper bonding pad 284, but the present disclosure is not limited thereto.

The upper capping layer 290 may be disposed below the second substrate 201 to cover the second substrate 201, the substrate insulating layer 219, the outer insulating layer 205, and the gate electrodes 230. The upper capping layer 290 may include a plurality of insulating layers. The upper capping layer 290 may include an insulating material, for example, silicon oxide, silicon nitride, silicon oxynitride, silicon oxycarbide, or the like.

The upper insulating layers 210 and 295 may be disposed on the second substrate 201. The upper insulating layers 210 and 295 may include a first upper insulating layer 210 covering the conductive patterns 268 and 269 and a second upper insulating layer 295 on the first upper insulating layer 210. The second upper insulating layer 295 may cover the source connection pattern 260 and the peripheral contact pad 265. The upper insulating layers 210 and 295 may include an insulating material, for example, silicon oxide, silicon nitride, silicon oxynitride, or silicon oxycarbide.

The conductive patterns 268 and 269 may be disposed on the second substrate 201. The conductive patterns 268 and 269 may include the first conductive pattern 268 electrically connected to the peripheral contact plug 254, on the peripheral contact plug 254, and second conductive patterns 269 electrically connected to the second substrate 201, on the second substrate 201. The source connection pattern 260 may be disposed on a level higher than the upper surface of the second substrate 201 with respect to the upper surface of the first substrate 101. The first conductive pattern 268 may electrically connect the input/output pad 300 and the peripheral contact plug 254 to each other. The first conductive pattern 268 may contact the peripheral contact via 267. The first conductive pattern 268 may be electrically connected to the circuit elements 120 in the peripheral circuit region PERI. The second conductive patterns 269 may be electrically connected to the second substrate 201 on the second substrate 201. Accordingly, the electrical resistance may be reduced and the semiconductor device 100 having improved electrical characteristics may be provided. The second conductive patterns 269 may contact the upper surface of the second substrate 201, and the second conductive patterns 269 may be disposed at substantially the same level as the first conductive pattern 268. The conductive patterns 268 and 269 may include a conductive material, for example, aluminum (Al).

The input/output pad 300 may be an input/output pad of the semiconductor device 100 and may be electrically connected to a controller. The input/output pad 300 may contact the peripheral contact via 267. The input/output pad 300 may be electrically connected to the circuit elements 120 of the peripheral circuit region PERI. The input/output pad 300 may include the same material as the source connection pattern 260. In an example embodiment, the input/output pad 300 may include aluminum (Al).

The protective layer 301 may be disposed on the upper insulating layers 210 and 295. The protective layer 301 may include a semiconductor material, for example, polyimide. The protective layer 301 may include a photosensitive material. The protective layer 301 may serve as a protective film. The protective layer 301 may include photosensitive polyimide (PSPI), and by using the same, process operations may be shortened and process defects may be reduced.

Figure 3A:
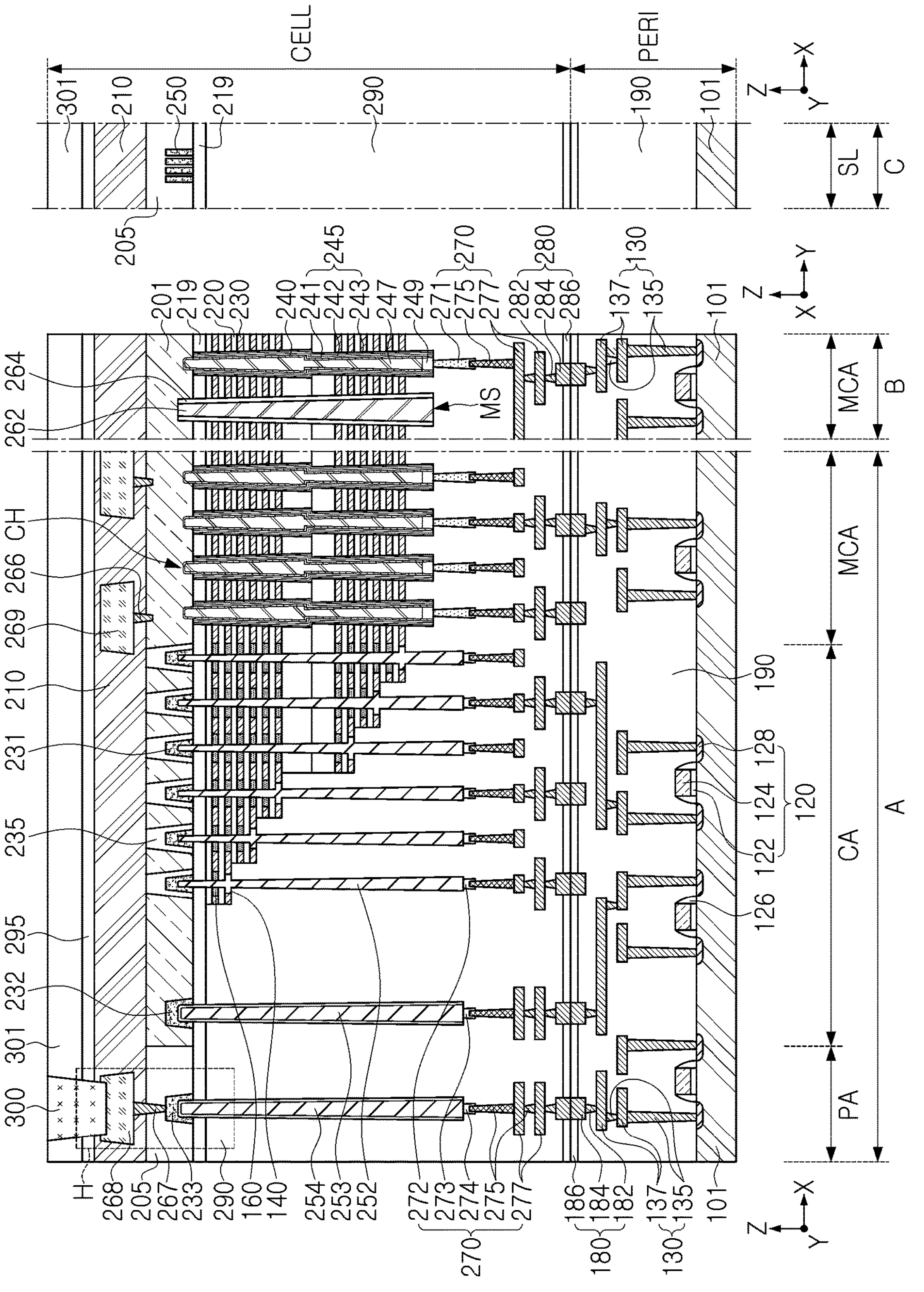
FIG. 3A is a cross-sectional view of a semiconductor device according to an example embodiment.
Figure 3B:
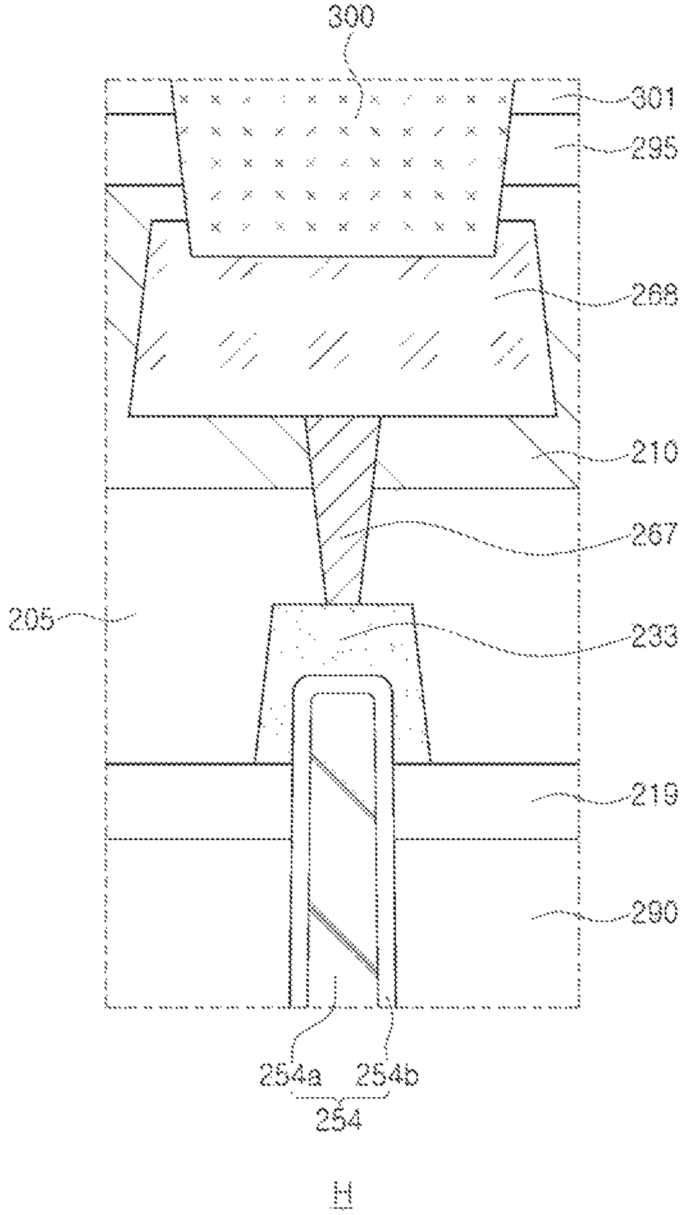
FIG. 3B is a diagram of a semiconductor device according to an example embodiment.

FIG. 3A is a cross-sectional view of a semiconductor device according to an example embodiment. FIG. 3B is a diagram of a semiconductor device according to an example embodiment.

FIG. 3B is an enlarged view of area 'H' of FIG. 3A. The same reference numerals as those of FIG. 2A indicate corresponding configurations, and descriptions overlapping with the above descriptions will be omitted.

Referring to FIGS. 3A and 3B, via patterns 266 between the second conductive patterns 269 and the second substrate 201 may be further included. In the semiconductor device of FIGS. 3A and 3B, the length of the peripheral contact via 267, the arrangement of the second conductive pattern 269, and the existence of the via patterns 266 may be partially different from those depicted in FIGS. 2A-2E. For example, the level of the upper surface of the peripheral contact via 267 may be higher than the level of the upper surface of the second substrate 201, and the via patterns 266 may be formed together. A lower surface of the peripheral contact via 267 may contact an upper surface of the third conductive pad 233. The second conductive pattern 269 and the via patterns 266 may be formed on the second substrate of the memory cell array region MCA. According to an example embodiment, the level of the upper surface of each of the via patterns 266 is higher than the level of the upper surface of the second substrate 201, the level of the lower surface of each of the via patterns 266 is lower than the level of the upper surface of the second substrate 201, and an upper surface of each of the via patterns 266 and a lower surface of each of the second conductive patterns 269 may contact each other. The peripheral contact via 267 and the via patterns 266 may be formed of a metal material, and may include, for example, tungsten (W).

Figure 4A:
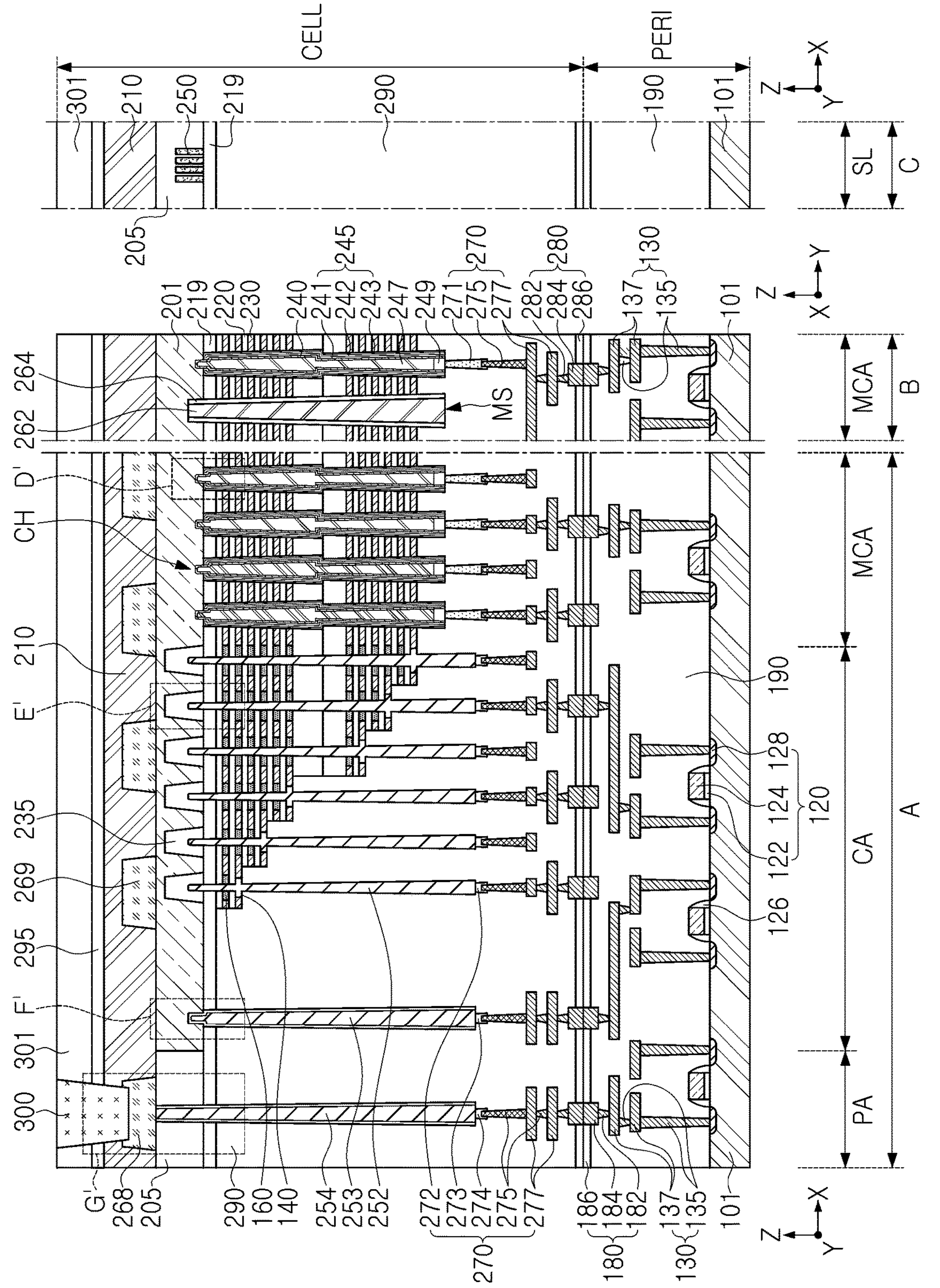
FIG. 4A is a cross-sectional view of a semiconductor device according to an example embodiment.
Figure 4B:
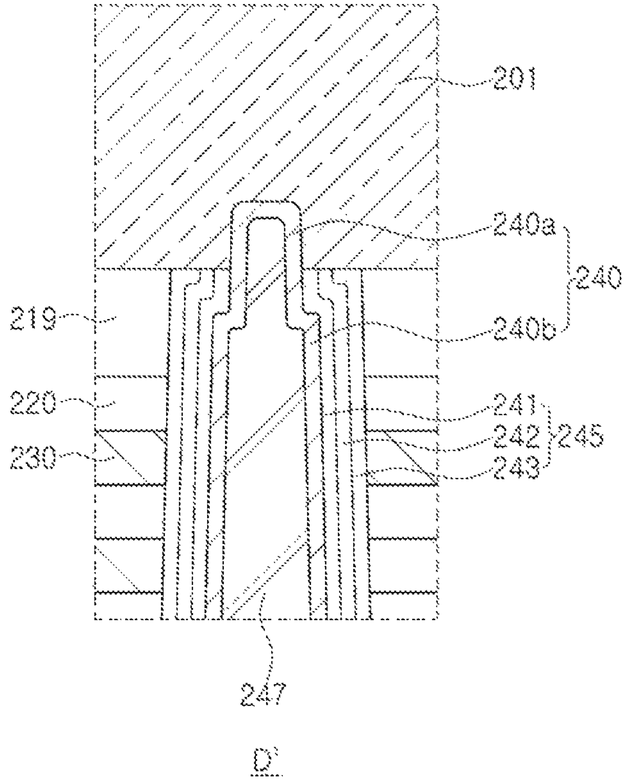
FIGS. 4B, 4C, 4D and 4E are diagrams of a semiconductor device according to an example embodiment.
Figure 4C:
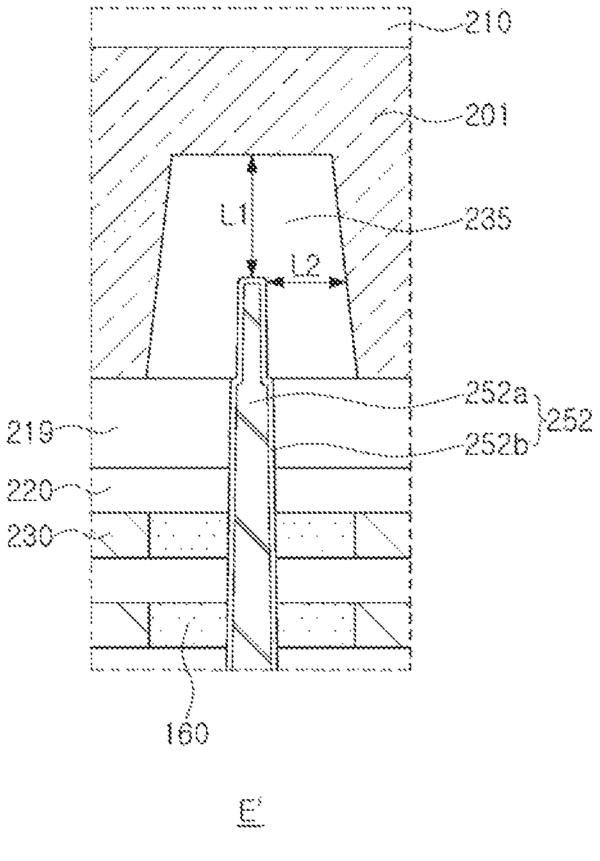
Figure 4D:
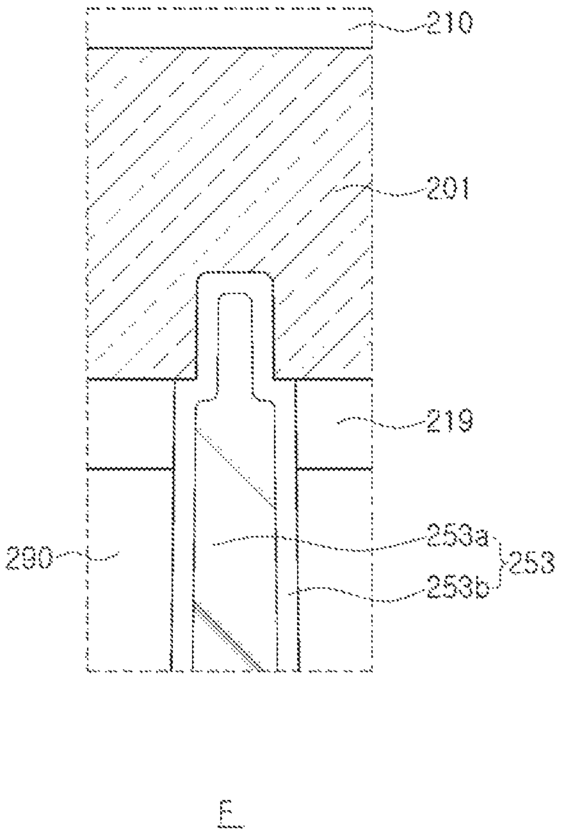
Figure 4E:
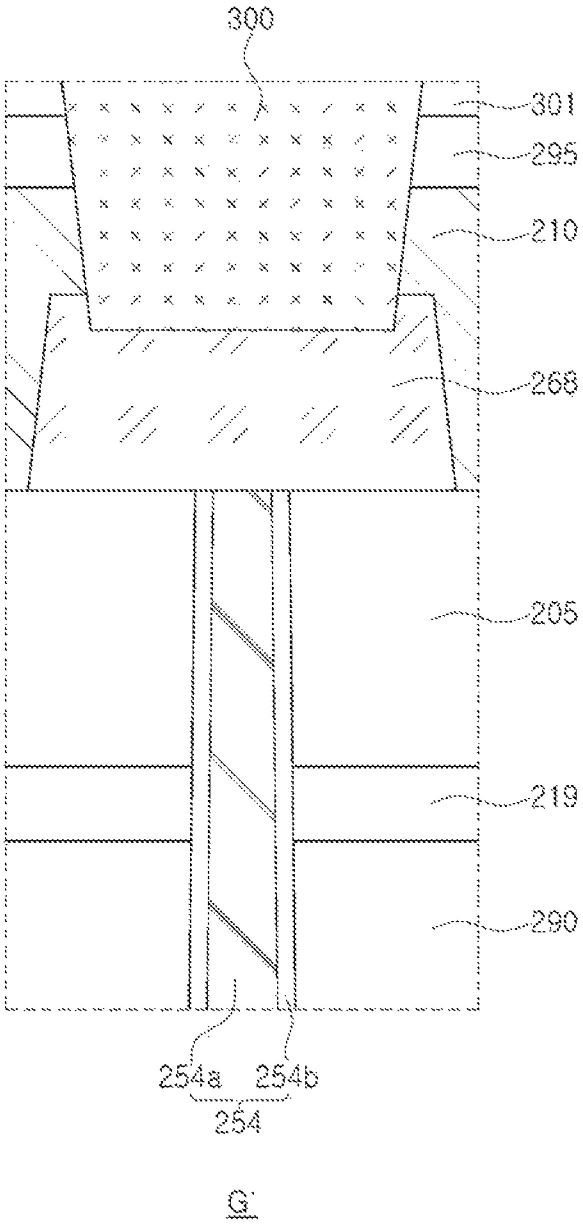

FIG. 4A is a cross-sectional view of a semiconductor device according to an example embodiment. FIGS. 4B, 4C, 4D and 4E are diagrams of a semiconductor device according to an example embodiment. FIG. 4B is an enlarged view of area 'D' of FIG. 4A, FIG. 4C is an enlarged view of area 'E' of FIG. 4A, and FIG. 4D is an enlarged view of area 'F' of FIG. 4A, FIG. 4E illustrates an enlarged area 'G' of FIG. 4A. The same reference numerals as those of FIG. 2A indicate corresponding configurations, and descriptions overlapping with the above descriptions will be omitted.

Referring to FIGS. 4A to 4E, the insulating patterns 235 may be formed by a wet and/or dry oxidation process. Since an oxidation process is performed on a base substrate 200, upper ends of the channel structures CH and the contact plugs 252, 253 and 254 may be formed to have a curved shape during the formation of the contact plugs 252, 253 and 254 and the channel structures CH.

The protruding portion 240*a* of the channel layer in the channel structures CH may be connected to the second substrate 201. Since an oxidation process is performed in the process of forming the contact plugs 252, 253, and 254 and the channel structures CH, the level of the upper surface of the protruding portion 240*a* of the channel layer may be lowered compared to the previous embodiment.

Each of the gate contact plugs 252 may pass through the gate electrodes 230, extend in the first direction Z, and may directly contact the insulating patterns 235, as opposed to contacting each of the first conductive pads 231. The gate contact plugs 252 may be spaced apart from the second substrate 201 by the insulating patterns 235. In FIG. 4C, among the gate contact plugs 252 and the insulating patterns 235, in the respective gate contact plugs 252 and the respective insulating patterns 235 adjacent to or contacting each other, a minimum distance L2 between each side surface of the gate contact plugs 252 and each side surface of the insulating patterns 235 contacting the second substrate 201 may be less than a distance L1 between the upper surface of each of the gate contact plugs 252 and the upper surface of each of the insulating patterns 235, but the present disclosure is not limited thereto. In a process in which the base substrate 200 is removed (refer to FIG. 6H), the insulating patterns 235 may protect the gate contact plugs 252 to provide the semiconductor device 100 having improved electrical characteristics.

The upper surface of the source contact plug 253 may directly contact the second substrate 201, as opposed to contacting the second conductive pad 232. Since an oxidation process is performed in the process of forming the source contact plug 253, the level of the upper surface of the source contact plug 253 may be lowered.

As opposed to the third conductive pad 233 on the outer area PA of the second substrate 201 and the upper portion of the peripheral contact plug 254 contacting each other, the peripheral contact plug 254 may pass through an outer insulating layer 205. As a result, the peripheral contact plug 254 may directly contact the first conductive pattern 268 to be electrically connected to the first conductive pattern 268. In the process of forming the peripheral contact plug 254, insulating patterns 235 may be formed on the peripheral contact plug 254. However, in a subsequent process (see FIG. 6H) in which the base substrate 200 is partially removed from the upper surface by a polishing process such as a grinding process, the upper surface of the peripheral contact plug 254 and the upper surface of the second substrate 201 may be coplanar. Accordingly, the conductive layer 254*a* of the peripheral contact plug 254 may contact the first conductive pattern 268.

Figure 5A:
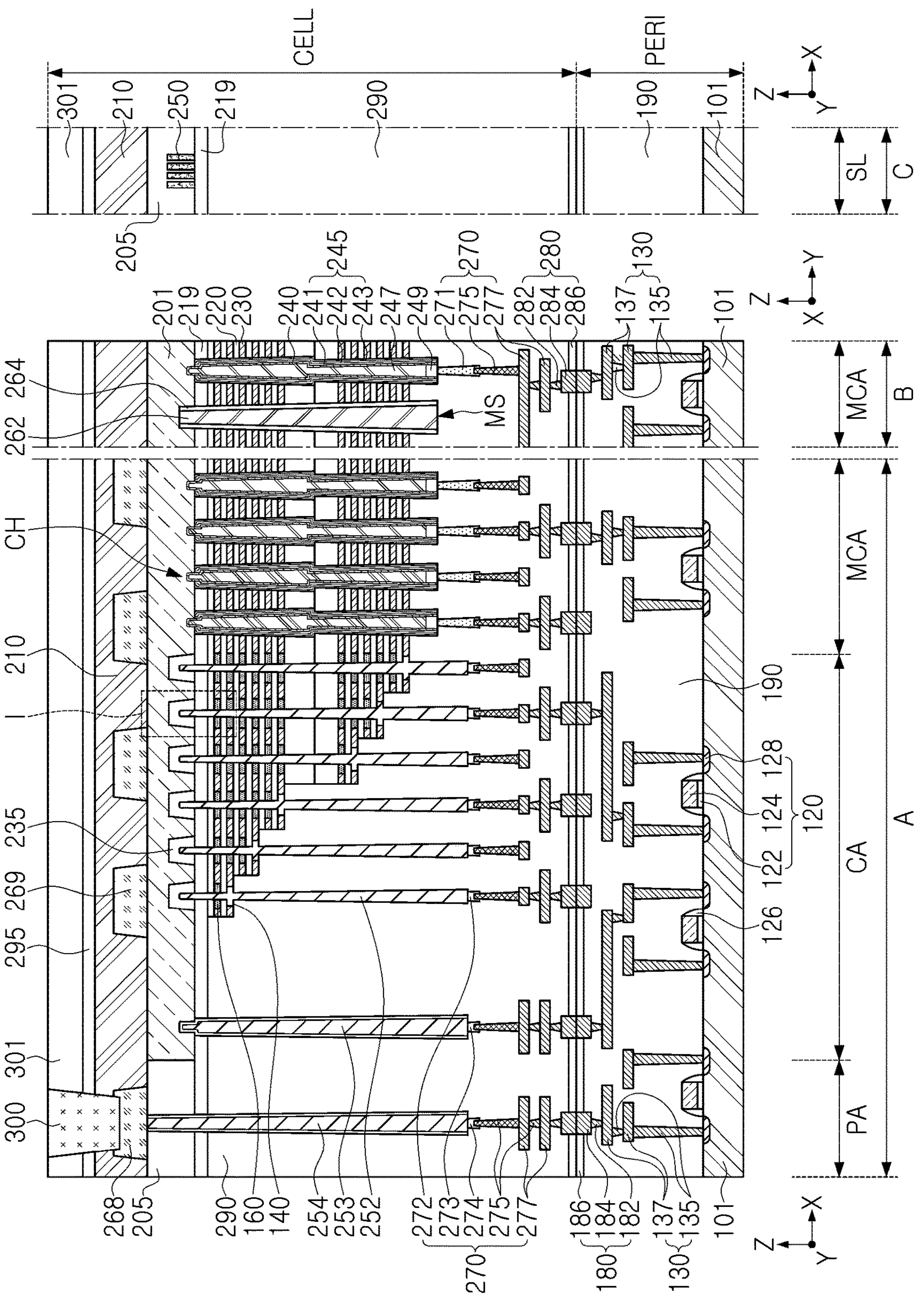
FIG. 5A is a cross-sectional view of a semiconductor device according to an example embodiment.
Figure 5B:
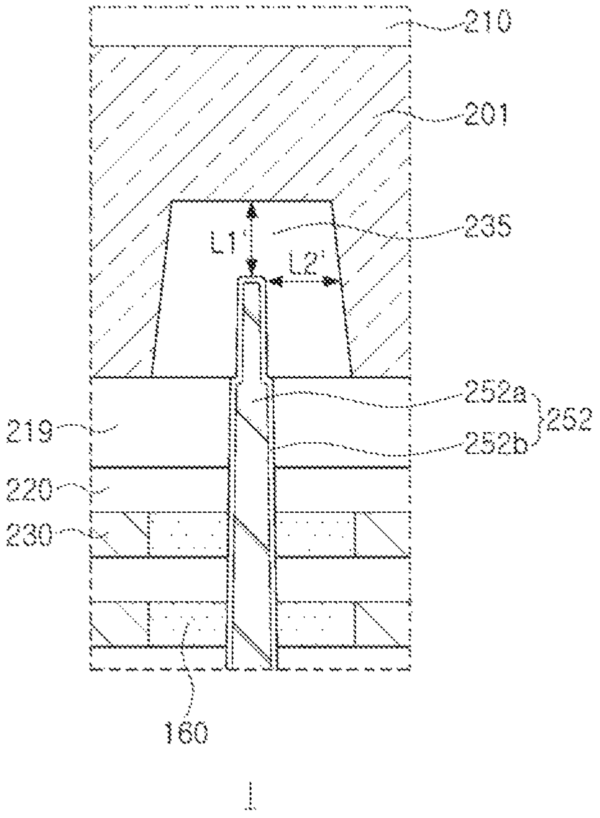
FIG. 5B is a diagram of a semiconductor device according to an example embodiment.

FIG. 5A is a cross-sectional view of a semiconductor device according to an example embodiment. FIG. 5B is a diagram of a semiconductor device according to an example embodiment. FIG. 5B is an enlarged view of area 'I' of FIG. 5A. The same reference numerals as in FIG. 4A indicate corresponding configurations, and descriptions overlapping the above descriptions will be omitted.

Referring to FIGS. 5A and 5B, the shape of the insulating patterns 235 may be partially different from the previous embodiments. For example, among the gate contact plugs 252 and the insulating patterns 235, in the respective gate contact plugs 252 and the respective insulating patterns 235 adjacent to or contacting each other, a minimum distance L2' between the side surfaces of each of the gate contact plugs 252 and the side surfaces of the insulating patterns 235 contacting the second substrate 201 may be substantially the same as a distance L1' between an upper surface of each of the gate contact plugs 252 and an upper surface of each of the insulating patterns 235. However, these shapes are examples, and the shape of the insulating patterns 235 may be variously changed according to example embodiments.

FIGS. 6A, 6B, 6C, 6D, 6E, 6F, 6G, 6H, 6I, 6J and 6K are cross-sectional views illustrating a method of manufacturing a semiconductor device according to an example embodiment. In FIGS. 6A to 6K, regions corresponding to the region illustrated in FIG. 2A are illustrated.

Figure 6A:
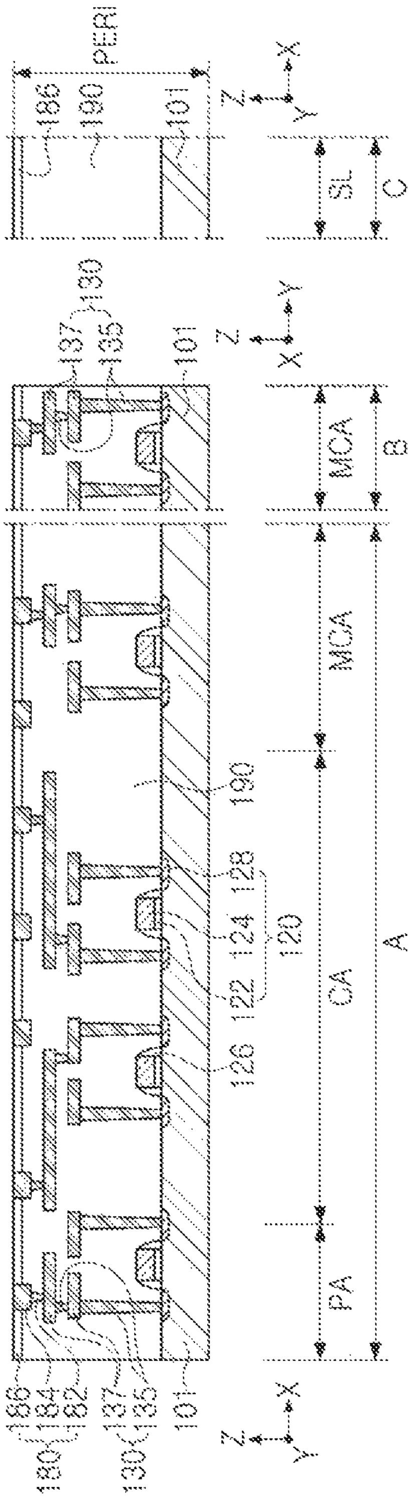
FIGS. 6A, 6B, 6C, 6D, 6E, 6F, 6G, 6H, 6I, 6J and 6K are cross-sectional views illustrating a method of manufacturing a semiconductor device according to an example embodiment.

Referring to FIG. 6A, the circuit elements 120, the lower interconnection structure 130, the lower bonding structure 180, and the lower capping layer 190, forming the peripheral circuit region PERI, may be formed on the first substrate 101.

Device isolation layers may be formed in the first substrate 101, and a circuit gate dielectric layer 122 and a circuit gate electrode 124 may be sequentially formed on the first substrate 101. The device isolation layers may be formed by, for example, a shallow trench isolation (STI) process. The circuit gate dielectric layer 122 may be formed on the first substrate 101, and the circuit gate electrode 124 may be formed on the circuit gate dielectric layer 122. Spacer layers 126 may be formed on both sidewalls of the circuit gate dielectric layer 122 and the circuit gate electrode 124, and source/drain regions 128 may be formed by implanting impurities into the active region of the first substrate 101, on both sides of the circuit gate electrode 124.

The lower contact plugs 135 of the lower interconnection structure 130 may be formed by forming a portion of the lower capping layer 190 and then partially etching and removing the same, and filling the conductive material. The lower interconnection lines 137 may be formed by, for example, depositing a conductive material and then patterning the same.

The lower bonding via 182 of the lower bonding structure 180 may be formed by forming a portion of the lower capping layer 190, then partially etching and removing and filling a conductive material. The lower bonding pad 184 may be formed by, for example, depositing a conductive material and then patterning the same. The lower bonding structure 180 may be formed by, for example, a deposition process or a plating process. The lower bonding insulating layer 186 may be formed to cover a portion of the upper surface and side surfaces of the lower bonding pad 184, and then may be formed by performing a planarization process until the upper surface of the lower bonding pad 184 is exposed.

The lower capping layer 190 may include a plurality of insulating layers. The lower capping layer 190 may be a portion in respective processes of forming the lower interconnection structure 130 and the lower bonding structure 180. Accordingly, the peripheral circuit region PERI may be formed.

Figure 6B:
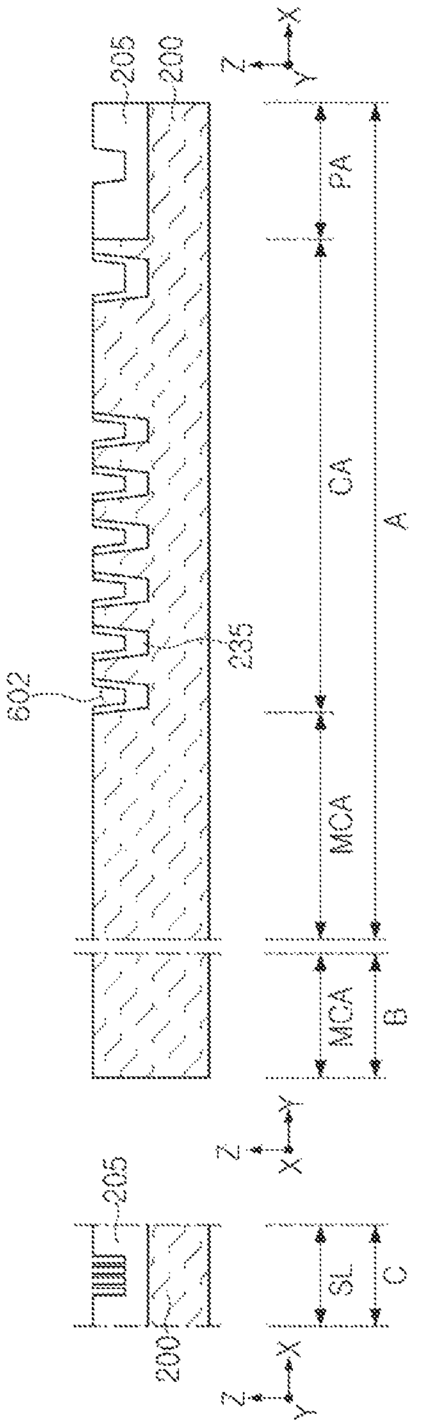

Referring to FIG. 6B, insulating patterns 235 and an outer insulating layer 205 may be formed on the base substrate 200. The base substrate 200 may include a semiconductor material, for example, a group IV semiconductor, a group III-V compound semiconductor, or a group II-VI compound semiconductor. The base substrate 200 may be provided to control the thickness of the second substrate 201 in a process of removing the base substrate 200. A portion of the base substrate 200 may be removed from the outer area PA. An outer insulating layer 205 may be formed in the area in which the second substrate 201 has been removed from the outer area PA and the alignment region SL. To form the insulating patterns 235 and the outer insulating layer 205, the base substrate 200 may be etched using a mask layer to form a trench in the base substrate 200. By filling the formed trench with an insulating material, the insulating patterns 235 and the outer insulating layer 205 may be formed. After the insulating patterns 235 and the outer insulating layer 205 are formed, to form the conductive pads 231, 232 and 233 and the alignment key 250 disposed in the alignment region SL, openings, such as opening 602, may be formed by etching the insulating patterns 235, the outer insulating layer 205, and the outer insulating layer 205 disposed in the alignment region SL, using a mask layer.

Figure 6C:
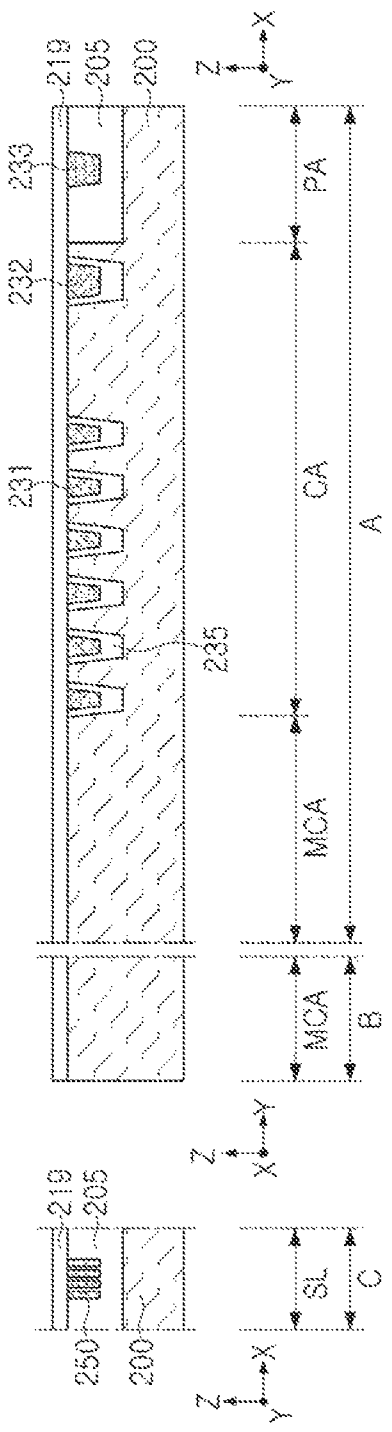

Referring to FIG. 6C, the conductive pads 231, 232, and 233 filling the openings formed in the insulating patterns 235 and the outer insulating layer 205, and the alignment key 250 filling the openings of the outer insulating layer 205 in the alignment region SL may be formed. A substrate insulating layer 219 covering the conductive pads 231, 232, and 233 and the alignment key 250 may be formed on the base substrate 200. In an example embodiment, a metal material is filled in the openings in the outer insulating layer 205 disposed in the alignment region SL, the insulating patterns 235 and the outer insulating layer 205, and a planarization process is performed thereon, and then, the substrate insulating layer 219 may be formed. The metal material may include, for example, tungsten (W), but is not limited thereto, and may be replaced with another conductive material. The substrate insulating layer 219 may be formed of an insulating material and may include, for example, silicon oxide, silicon nitride, silicon oxynitride, or silicon oxycarbide.

Figure 6D:
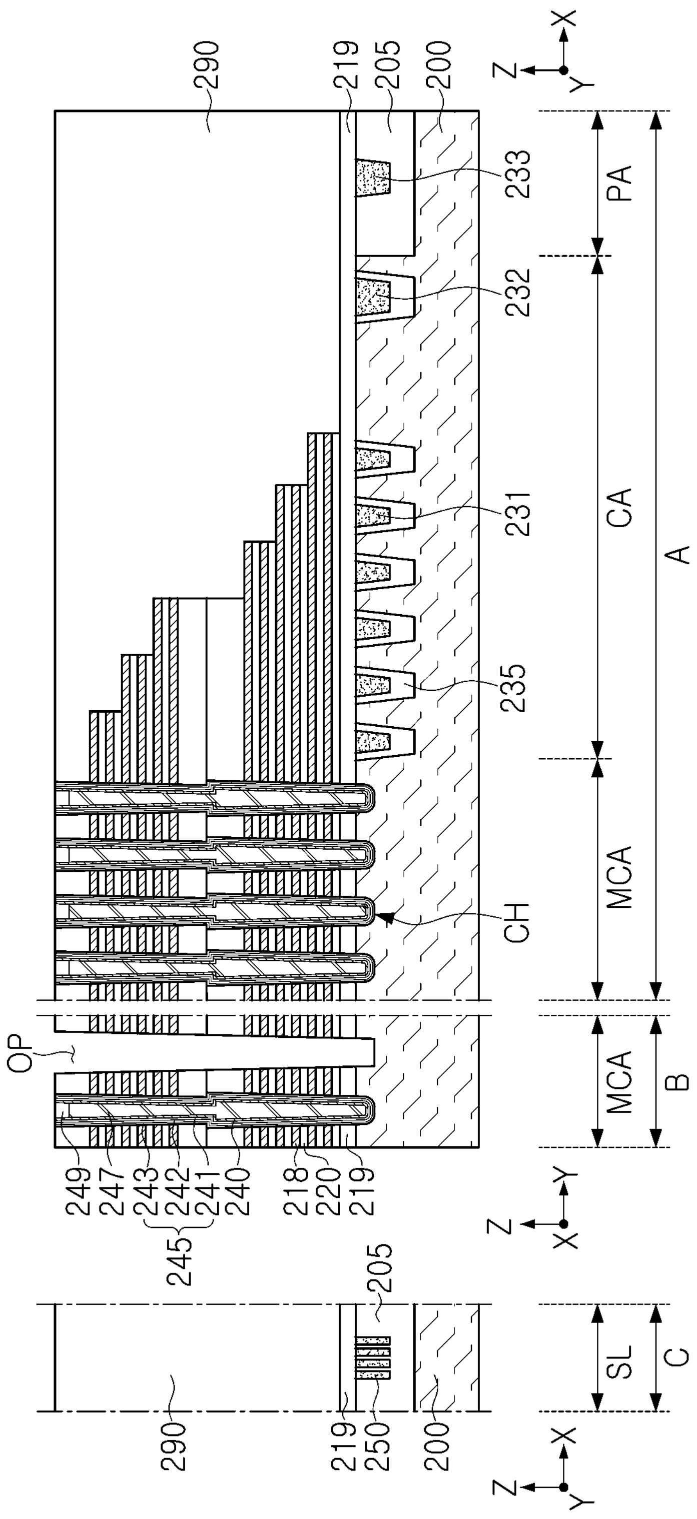

Referring to FIG. 6D, the sacrificial insulating layers 218 and the interlayer insulating layers 220 may be alternately stacked to form a lower stack structure, and the sacrificial insulating layers 218 and the interlayer insulating layers 220 may be alternately stacked to form an upper stack structure. Channel structures CH passing through the stack structure of the sacrificial insulating layers 218 and the interlayer insulating layers 220 may be formed. The opening OP passing through the stack structure of the sacrificial insulating layers 218 and the interlayer insulating layers 220 may be formed in a region corresponding to the separation region MS (refer to FIG. 2A).

The sacrificial insulating layers 218 may be partially replaced by the gate electrodes 230 (refer to FIG. 2A) through a subsequent process. The sacrificial insulating layers 218 may be formed of a material different from a material of the interlayer insulating layers 220, and may be formed of a material that may be etched with etch selectivity with respect to the interlayer insulating layers 220 under specific etching conditions. For example, the interlayer insulating layer 220 may be formed of at least one of silicon oxide and silicon nitride, and the sacrificial insulating layers 218 may be formed of a material different from the material of the interlayer insulating layer 220, for example, a material selected from silicon, silicon oxide, silicon carbide, and silicon nitride. In example embodiments, the thicknesses of the interlayer insulating layers 220 may not all be the same. The thickness of the interlayer insulating layers 220 and the sacrificial insulating layers 218 and the number of layers constituting the interlayer insulating layers 220 and the sacrificial insulating layers 218 may be variously changed from those illustrated.

A photolithography process and etching process for the sacrificial insulating layers 218 using a mask layer may be performed repeatedly, such that the upper sacrificial insulating layers extend shorter than the lower sacrificial insulating layers in the connection area CA. Accordingly, the sacrificial insulating layers 218 may form a stepped structure in a predetermined unit.

The vertical sacrificial structure may be formed by anisotropically etching the lower stack structure of the sacrificial insulating layers 218 and the interlayer insulating layers 220 using a mask layer, and may be formed by forming hole-shaped lower channel holes and then filling the same. The vertical sacrificial structure may include a semiconductor material such as polycrystalline silicon. In an example embodiment, the vertical sacrificial structure may include at least one of silicon oxide, silicon nitride, and silicon oxynitride. After the vertical sacrificial structure is formed, an upper stack structure of the sacrificial insulating layers 218 and the interlayer insulating layers 220 may be formed on the lower stack structure and the vertical sacrificial structure.

An upper capping layer 290 covering the stack structure of the sacrificial insulating layers 218 and the interlayer insulating layers 220 may be partially formed.

The channel structures CH may be formed by filling hole-shaped channel holes with a plurality of layers. The plurality of layers may include a gate dielectric layer 245, a channel layer 240, a channel filling insulating layer 247, and a channel pad 249. The upper channel holes of the channel holes may be formed by anisotropically etching the upper stack structure of the sacrificial insulating layers 218 and the interlayer insulating layers 220 using a separate mask layer. The lower channel holes of the channel holes may be formed by removing the vertical sacrificial structure exposed through the upper channel holes.

Due to the height of the stack structure, sidewalls of the channel structures CH may not be perpendicular to the upper surface of the second substrate 201. The channel structures CH may be formed to recess a portion of the second substrate 201.

The gate dielectric layer 245 may be formed to have a uniform thickness. In this operation, the entirety or a portion of the gate dielectric layer 245 may be formed, and a portion extending perpendicularly to the second substrate 201 along the channel structures CH may be formed in this operation. The channel layer 240 may be formed on the gate dielectric layer 245 in the channel structures CH. The channel filling insulating layer 247 may be formed to fill the channel structures CH, and may be an insulating material. The channel pad 249 may be formed of a conductive material, for example, polycrystalline silicon.

Figure 6E:
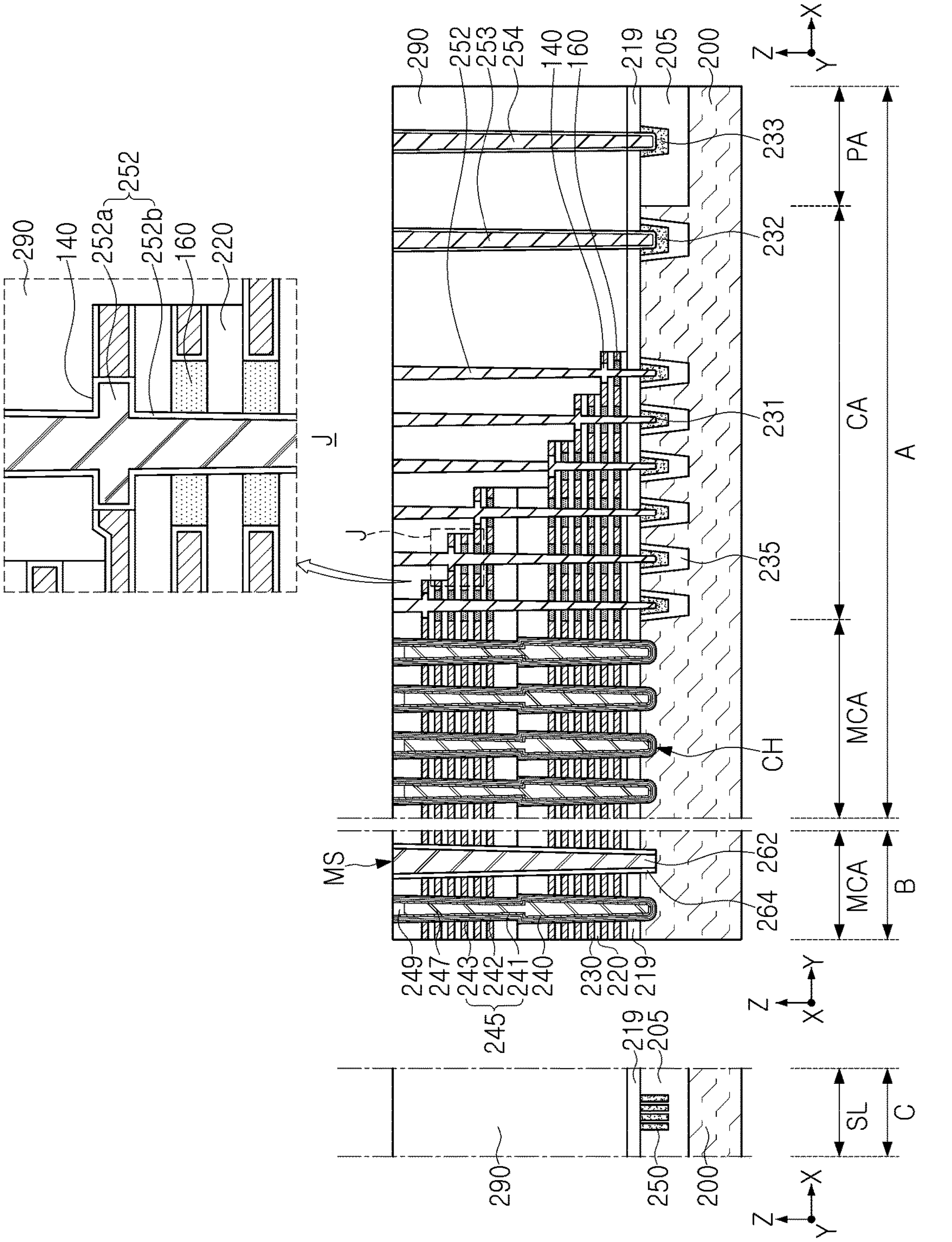

Referring to FIG. 6E and the magnified section 'J', the sacrificial insulating layers 218 (refer to FIG. 6D) may be removed through the opening (OP of FIG. 6D), and the gate electrodes 230 may be formed.

The gate contact plugs 252, the source contact plug 253, and the peripheral contact plug 254 may be formed.

Contact holes may be formed in positions corresponding to the contact plugs 252, 253, and 254 of FIG. 2A.

The contact holes may be formed to pass through the stack structure of the sacrificial insulating layers 218 and the interlayer insulating layers 220, and to pass through the substrate insulating layer 219 therebelow. The contact holes may be formed to partially recess the base substrate 200. The contact holes may be formed to pass through portions of the conductive pads 231, 232, and 233. The lower ends of the contact holes may be located in the conductive pads 231, 232, and 233, but the present disclosure is not limited thereto.

Tunnel portions may be formed by removing the sacrificial insulating layers 218 and the pad region 140 to a predetermined length around the contact holes.

Horizontal openings may be formed by forming preliminary gate contact plug insulating layers in the tunnel portions and the contact holes, filling the vertical sacrificial layers, and then removing the sacrificial insulating layers 218 through the opening OP.

The preliminary gate contact plug insulating layers may remain thereafter to form the gate contact plug insulating layers 160. The preliminary gate contact plug insulating layers may be deposited by, for example, an ALD process. The preliminary gate contact plug insulating layers may include, for example, an insulating material such as oxide or silicon oxide.

The vertical sacrificial layers may be formed to fill the remaining space in the contact holes. The vertical sacrificial layers may include a material different from a material of the preliminary gate contact plug insulating layers, and for example, include polycrystalline silicon.

The sacrificial insulating layers 218 may be selectively removed with respect to the interlayer insulating layers 220 and the substrate insulating layer 219 using, for example, wet etching. Accordingly, horizontal openings may be formed between the interlayer insulating layers 220.

The gate electrodes 230 may be formed by filling the horizontal openings with a conductive material, and some of the preliminary gate contact plug insulating layers and the vertical sacrificial layers may be removed to form the gate contact plug insulating layers 160.

The conductive material forming the gate electrodes 230 may fill the horizontal openings. The conductive material may include a metal, polycrystalline silicon, or metal silicide material. After the gate electrodes 230 are formed, an isolation insulating layer 264 may be formed in the openings formed in the separation region MS.

Vertical sacrificial layers in the contact holes may be selectively removed. After the vertical sacrificial layers are removed, the exposed preliminary contact plug insulating layers may be partially removed through an etching process, for example, a wet etching process. In this case, all of the preliminary contact plug insulating layers may be removed from the pad regions 140, and the gate electrode 230 may be exposed, and the preliminary contact plug insulating layers may remain therebelow to form the gate contact plug insulating layers 160. Accordingly, the gate electrode 230 disposed below the gate electrode 230 of the pad regions 140 may not be exposed from the contact holes by the gate contact plug insulating layers 160, and the contact holes and the gate electrode 230 disposed below the gate electrode 230 of the pad regions 140 may be separated by the gate contact plug insulating layers 160.

A conductive material may be deposited in the contact holes to form contact plugs 252, 253, and 254.

The gate contact plugs 252 may be formed to be connected to the gate electrodes 230 in the connection area CA, and the source contact plug 253 may be formed to be connected to the base substrate 200 in the connection area CA. The peripheral contact plug 254 may be formed to be connected to the third conductive pad 233 in the outer area PA. The gate contact plugs 252, the source contact plug 253, and the peripheral contact plug 254 may be formed to have different depths, and may be formed by forming the contact holes at the same time by using an etch stop layer or the like and then by filling the contact holes with a conductive material. However, in example embodiments, some of the gate contact plugs 252, the source contact plug 253, and the peripheral contact plug 254 may also be formed in different process operations.

Tunnel portions may be formed by removing the sacrificial insulating layers 218 through the opening OP, and gate electrodes 230 may be formed by filling the tunnel portions with a conductive material. The conductive material may include a metal, polycrystalline silicon, or metal silicide material. After the gate electrodes 230 are formed, the conductive material deposited in the opening OP may be removed through an additional process, to be filled with an insulating material, thereby forming the separation region MS.

Figure 6F:
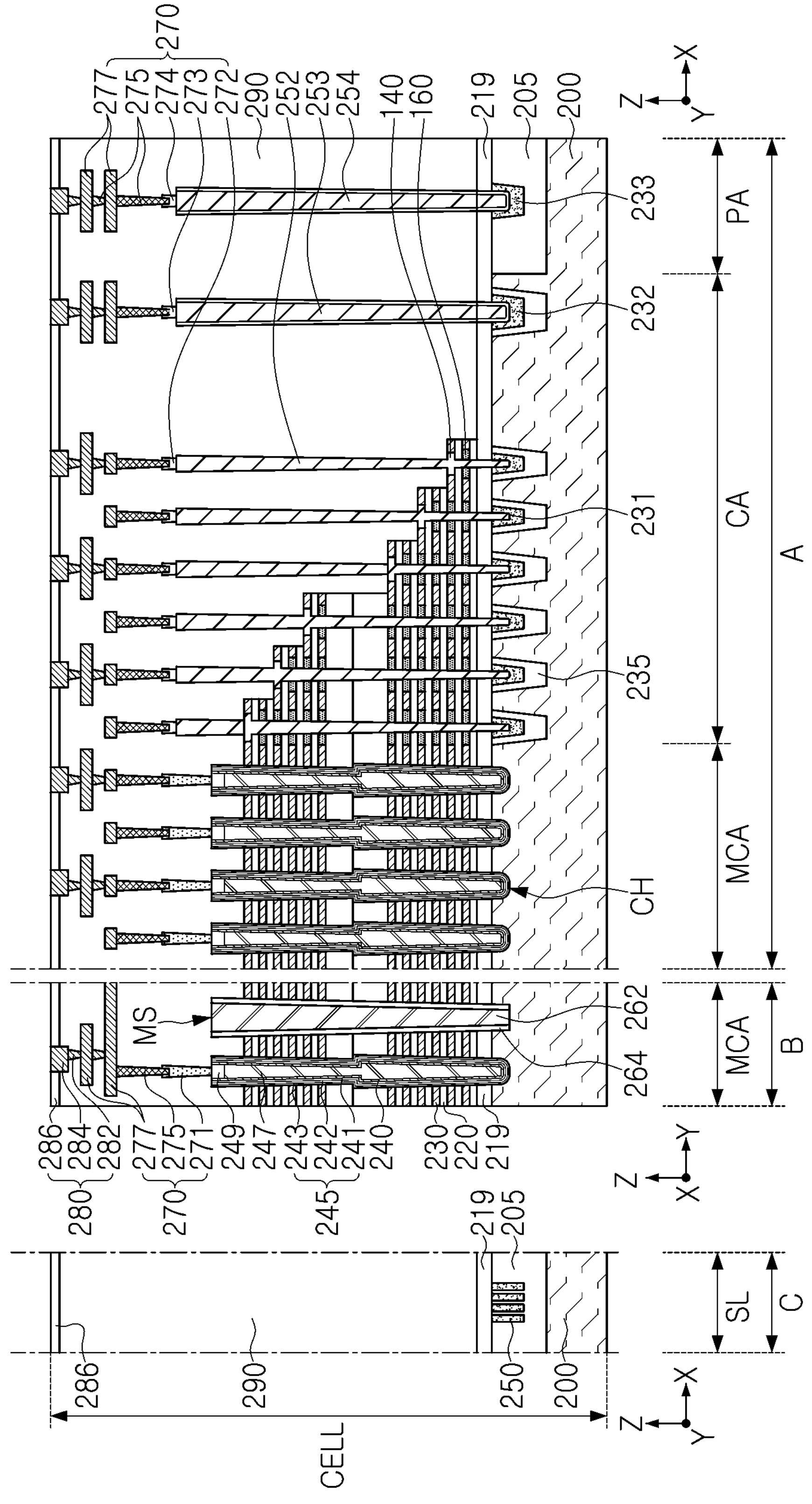

Referring to FIG. 6F, an upper interconnection structure 270 including channel contact plugs 271 may be formed, and an upper bonding structure 280 may be formed.

The channel contact plugs 271 may be formed to be connected to the channel structures CH in the memory cell array region MCA. The contact studs 272, 273, and 274 may be formed to be respectively connected to the gate contact plugs 252, the source contact plug 253, and the peripheral contact plug 254. The upper contact plugs 275 may be formed on the contact studs 272, 273, and 274, and may connect the upper interconnection lines 277 to each other vertically.

The upper bonding structure 280 may be formed in a manner similar to that of forming the lower bonding structure 180. Accordingly, the memory cell region CELL may be formed. However, during the process of manufacturing the semiconductor device, the memory cell region CELL may further include the base substrate 200.

Figure 6G:
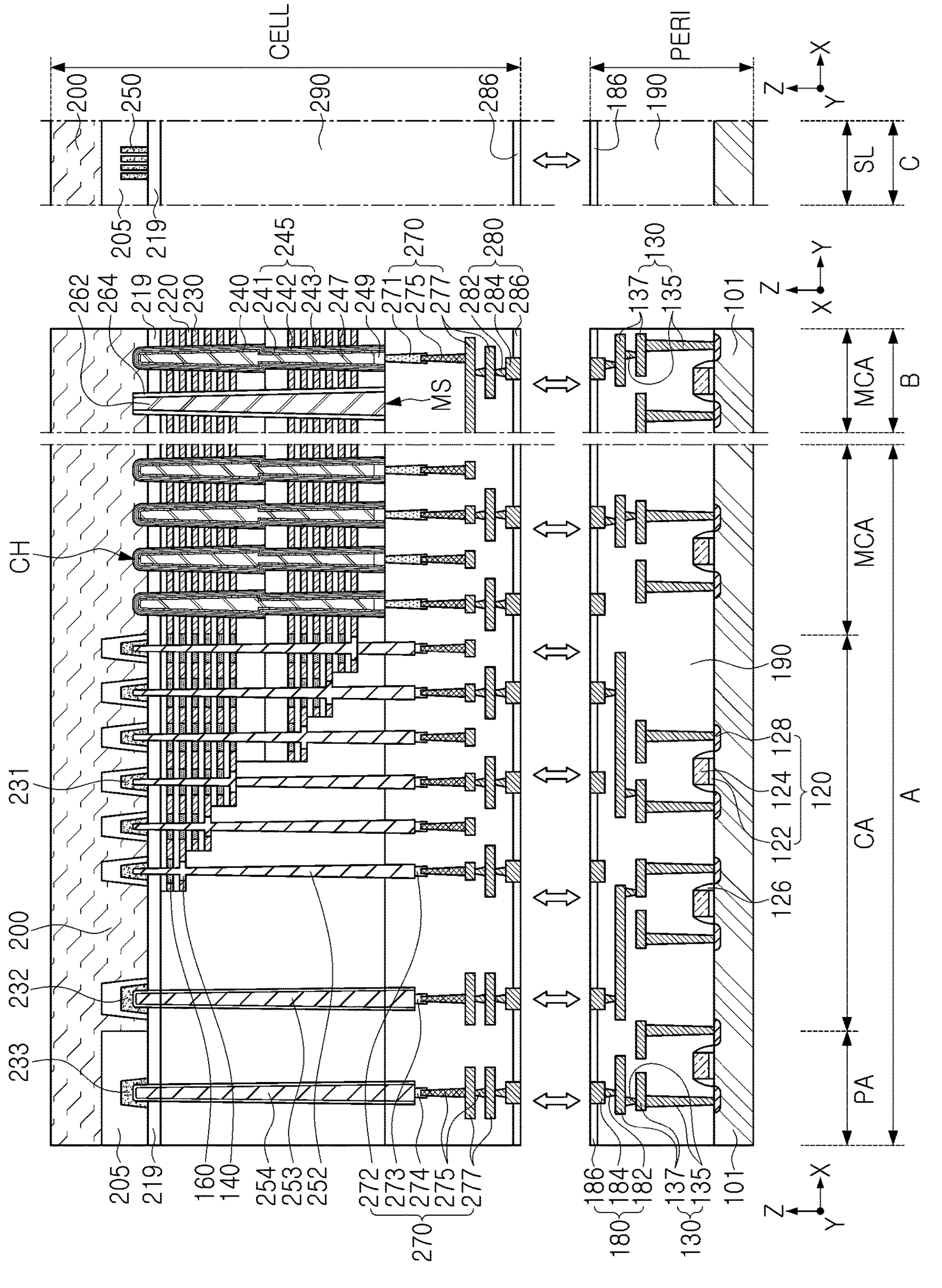

Referring to FIG. 6G, the peripheral circuit region PERI as the first substrate structure and the memory cell region CELL as the second substrate structure may be bonded.

The peripheral circuit region PERI and the memory cell region CELL may be connected by bonding the lower bonding pad 184 and the upper bonding pad 284 by pressing. The lower bonding insulating layer 186 and the upper bonding insulating layer 286 may be bonded and connected by pressing. The memory cell region CELL may be turned over on the peripheral circuit region PERI, to be bonded thereto, such that the upper bonding pad 284 faces downward. The peripheral circuit region PERI and the memory cell region CELL may be directly bonded without the intervening of an adhesive such as a separate adhesive layer.

Figure 6H:
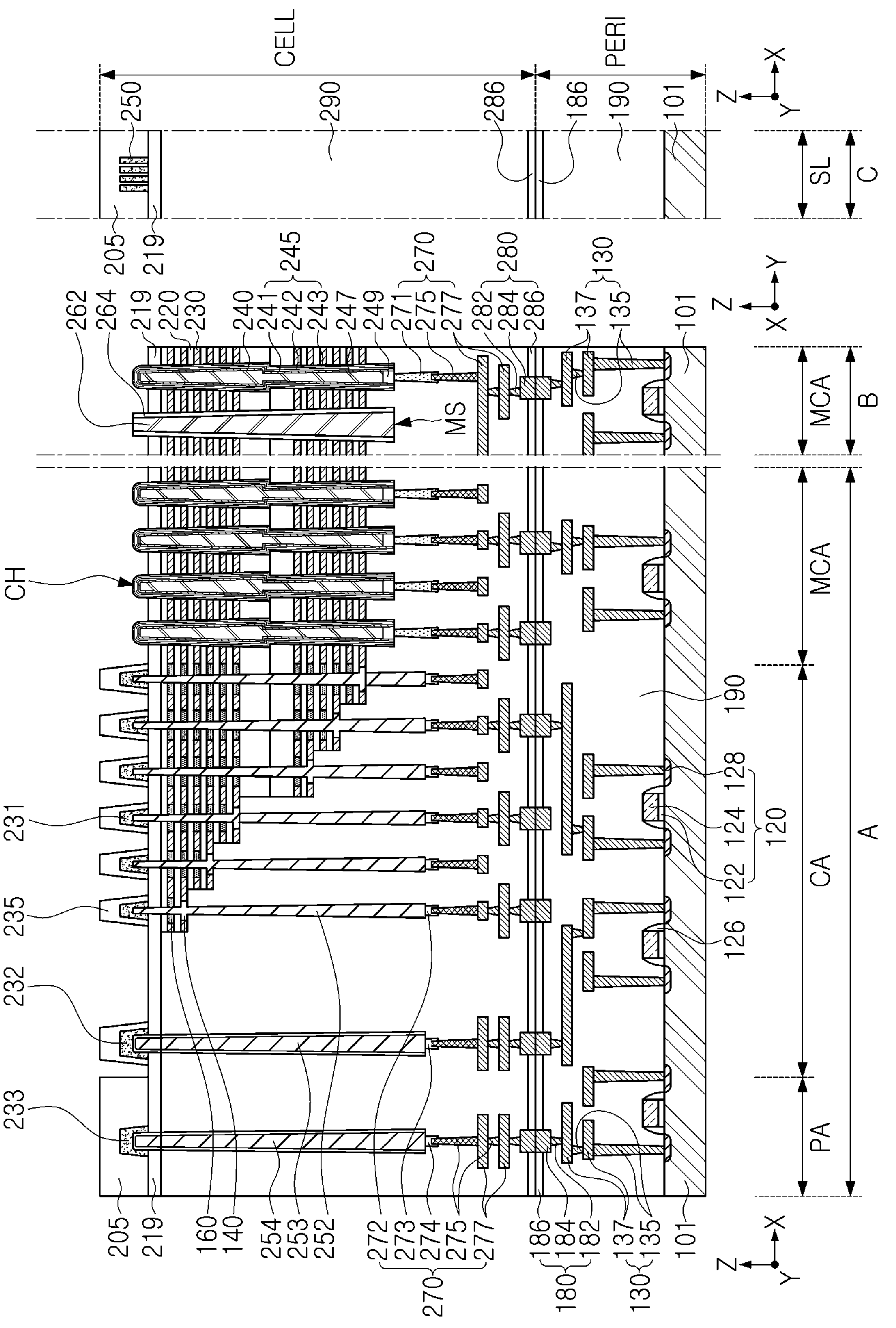

Referring to FIG. 6H, the base substrate 200 may be removed.

A portion of the base substrate 200 may be removed from the upper surface by a polishing process such as a grinding process, and the remaining part may be removed by an etching process such as wet etching and/or dry etching. Alternatively, the entire base substrate 200 may be removed by an etching process. For example, when the outer insulating layer 205, the gate dielectric layer 245, and the insulating patterns 235 include an oxide, the etching process may be performed by setting conditions such that etching is stopped in the oxide. Accordingly, the base substrate 200 may be selectively removed, such that the insulating patterns 235 and the channel structures CH protrude onto the substrate insulating layer 219 in the region in which the base substrate 200 has been removed.

Figure 6I:
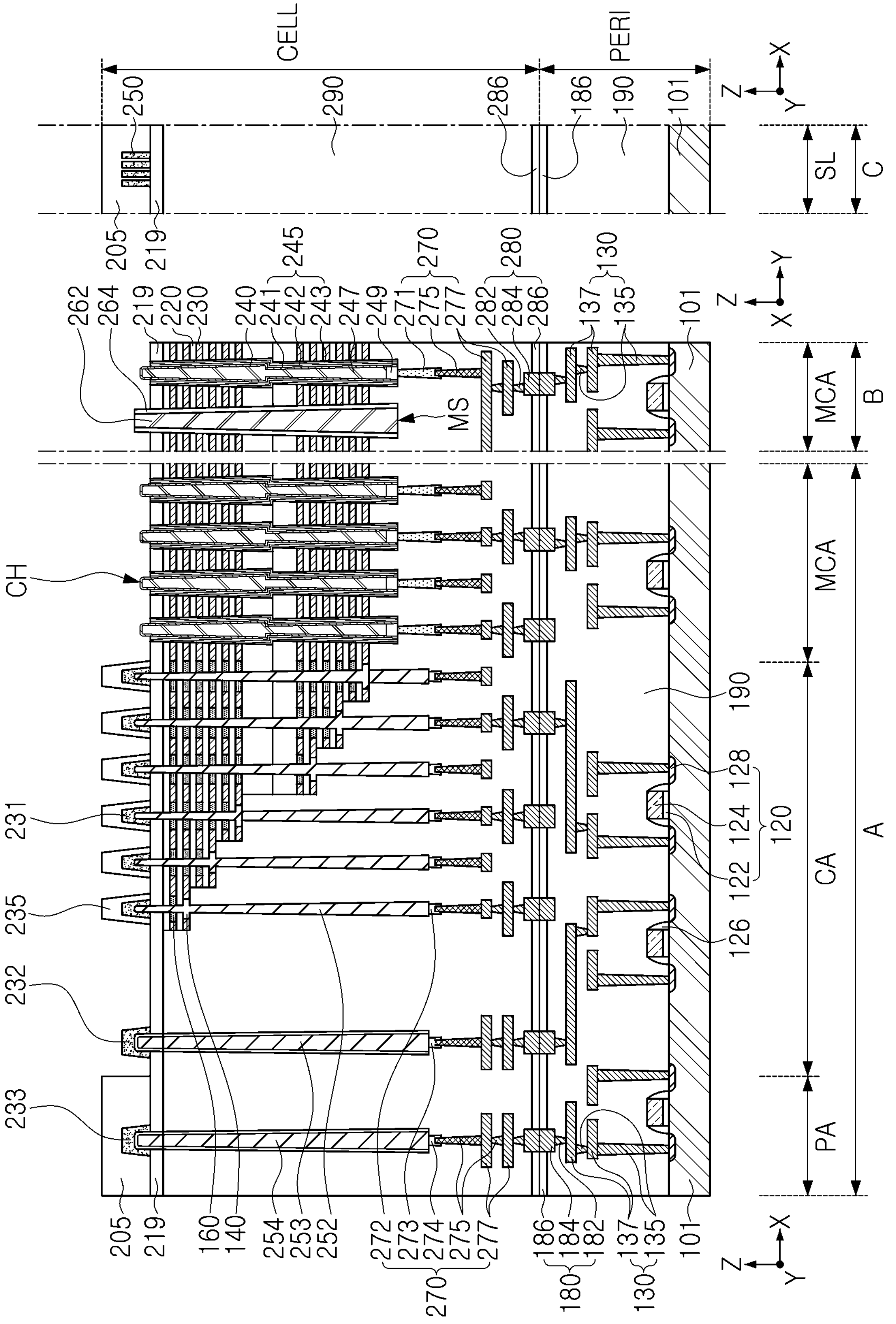

Referring to FIG. 6I, the insulating pattern 235 on the source contact plug 253 and the gate dielectric layer 245 on the channel structure CH may be removed.

The insulating pattern 235 and the gate dielectric layer 245 on the source contact plug 253 may be removed by a photolithography process and etching processes such as wet etching and/or dry etching. For example, the insulating pattern 235 on the source contact plug 253 may be first removed using a mask layer, and then the gate dielectric layer 245 may be removed. Accordingly, when a subsequent process is performed, the second conductive pad 232 on the source contact plug 253 and the protruding portion 240*a* of the channel layer 240 may contact the second substrate 201.

Figure 6J:
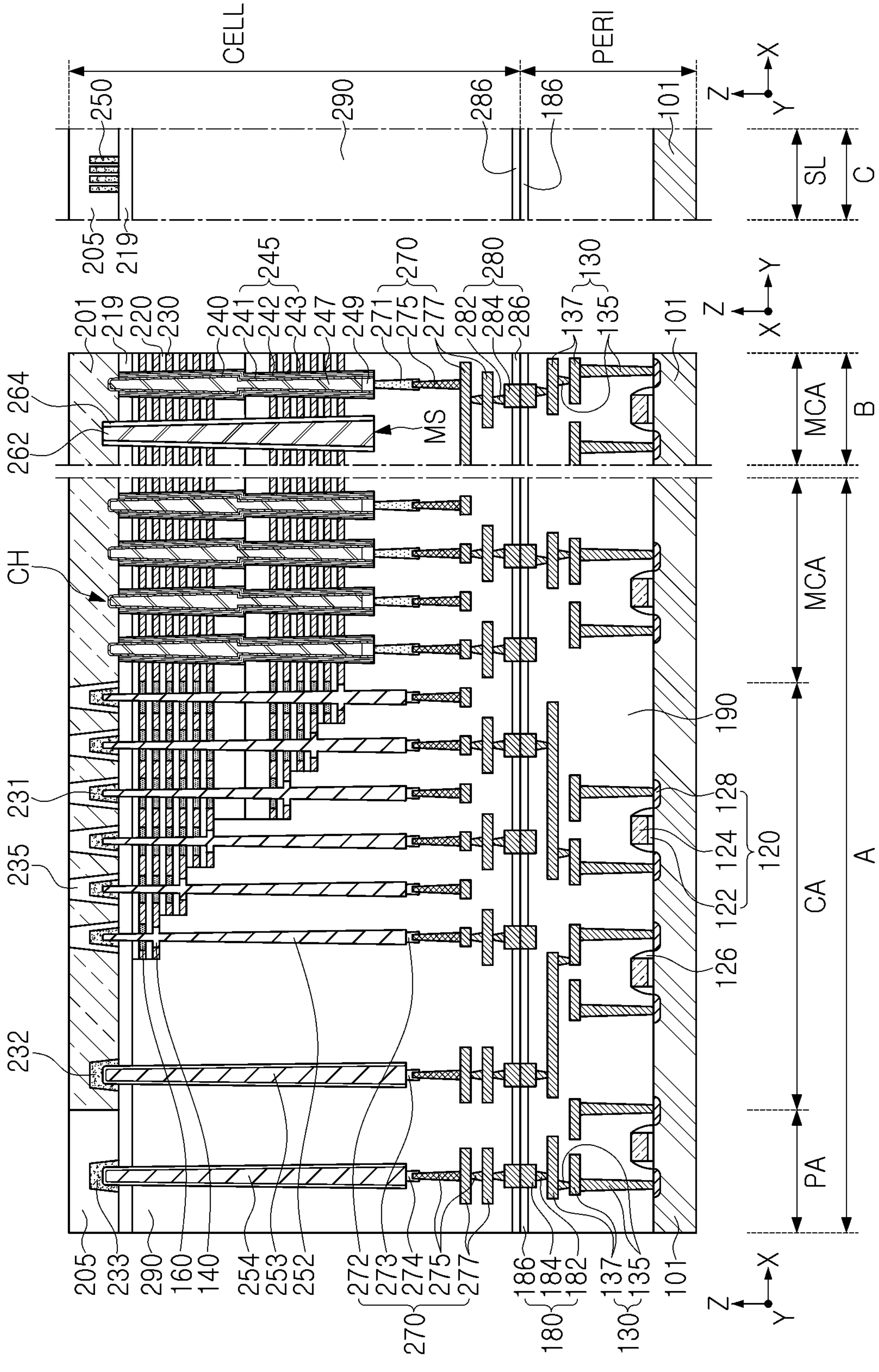

Referring to FIG. 6J, after the second substrate 201 is formed, a portion thereof may be removed.

The second substrate 201 may be formed by depositing N-type doped polysilicon on the outer insulating layer 205 and the substrate insulating layer 219. The second substrate 201 may be removed by, for example, a polishing process such as a grinding process or a chemical mechanical polishing process. Accordingly, the upper surface of the outer insulating layer 205 may be exposed, and the levels of upper surfaces of the outer insulating layer 205, the insulating patterns 235 and the second substrate 201 may be substantially the same.

Figure 6K:
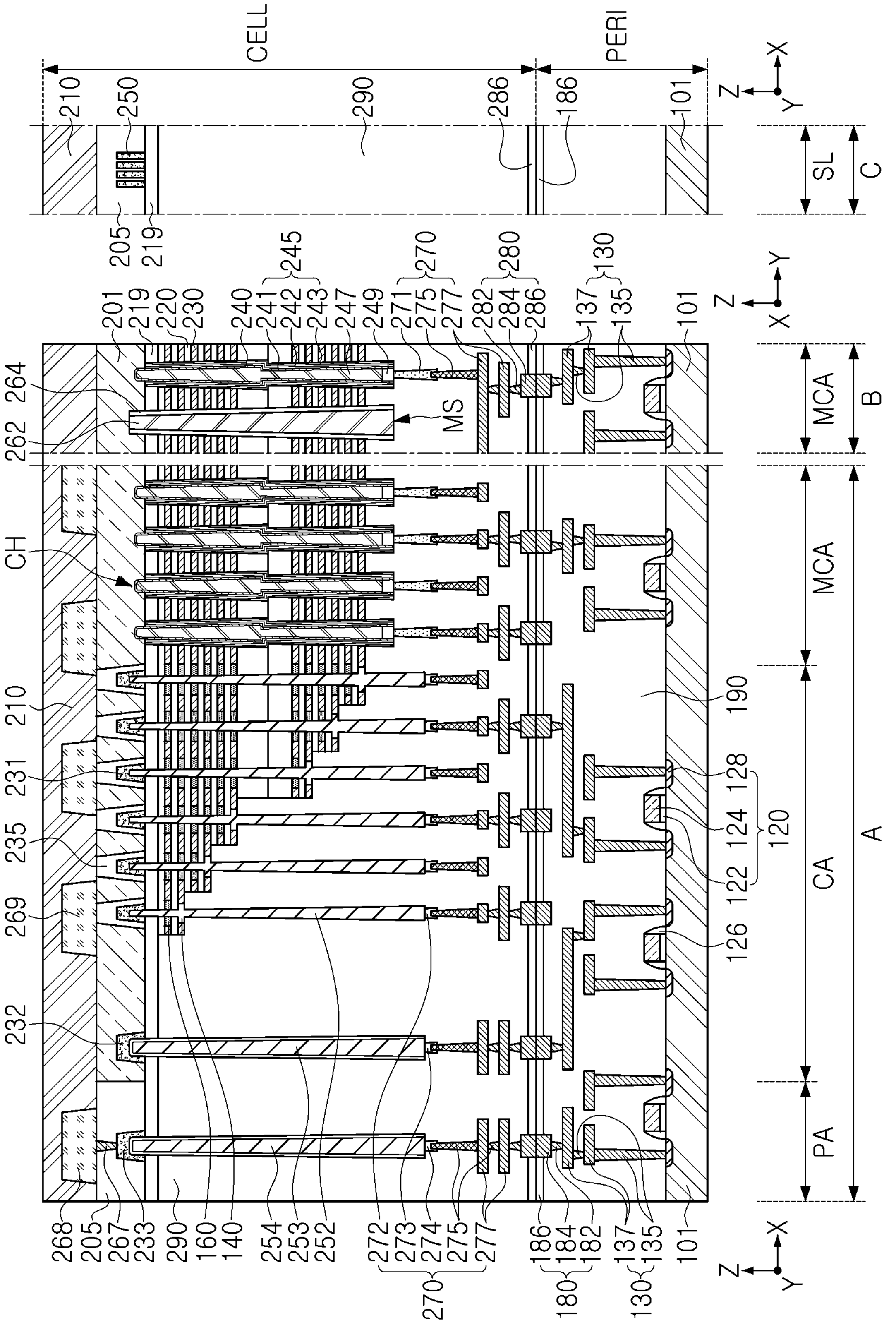

Referring to FIG. 6K, the peripheral contact via 267 on the third conductive pad 233, the first conductive pattern 268 on the peripheral contact via 267, the second conductive pattern 269 on the second substrate 201, and a first upper insulating layer covering the conductive patterns 268 and 269 may be formed.

After forming via-holes on the outer insulating layer 205, a peripheral contact via 267 may be formed by filling the via-holes with a conductive material. The level of the upper surface of the peripheral contact via 267 may be substantially the same as the level of the upper surface of the second substrate 201, but may be higher than the level of the upper surface of the second substrate 201. When the level of the upper surface of the peripheral contact via 267 is higher than the level of the upper surface of the second substrate 201, via patterns 266 may also be formed (refer to FIG. 3A).

A metal layer may be formed on the second substrate 201 and the outer insulating layer 205, and the conductive patterns 268 and 269 may be formed by patterning the metal layer.

The second upper insulating layer 295 may be formed and the protective layer 301 may be formed on the second upper insulating layer 295. The input/output pad 300 may be formed by forming a via hole passing through a portion of the first conductive pattern 268, the second upper insulating layer 295, and the protective layer 301, and then filling the via hole with a conductive material. Accordingly, the semiconductor device of FIGS. 1 to 2E may be manufactured.

Figure 7:
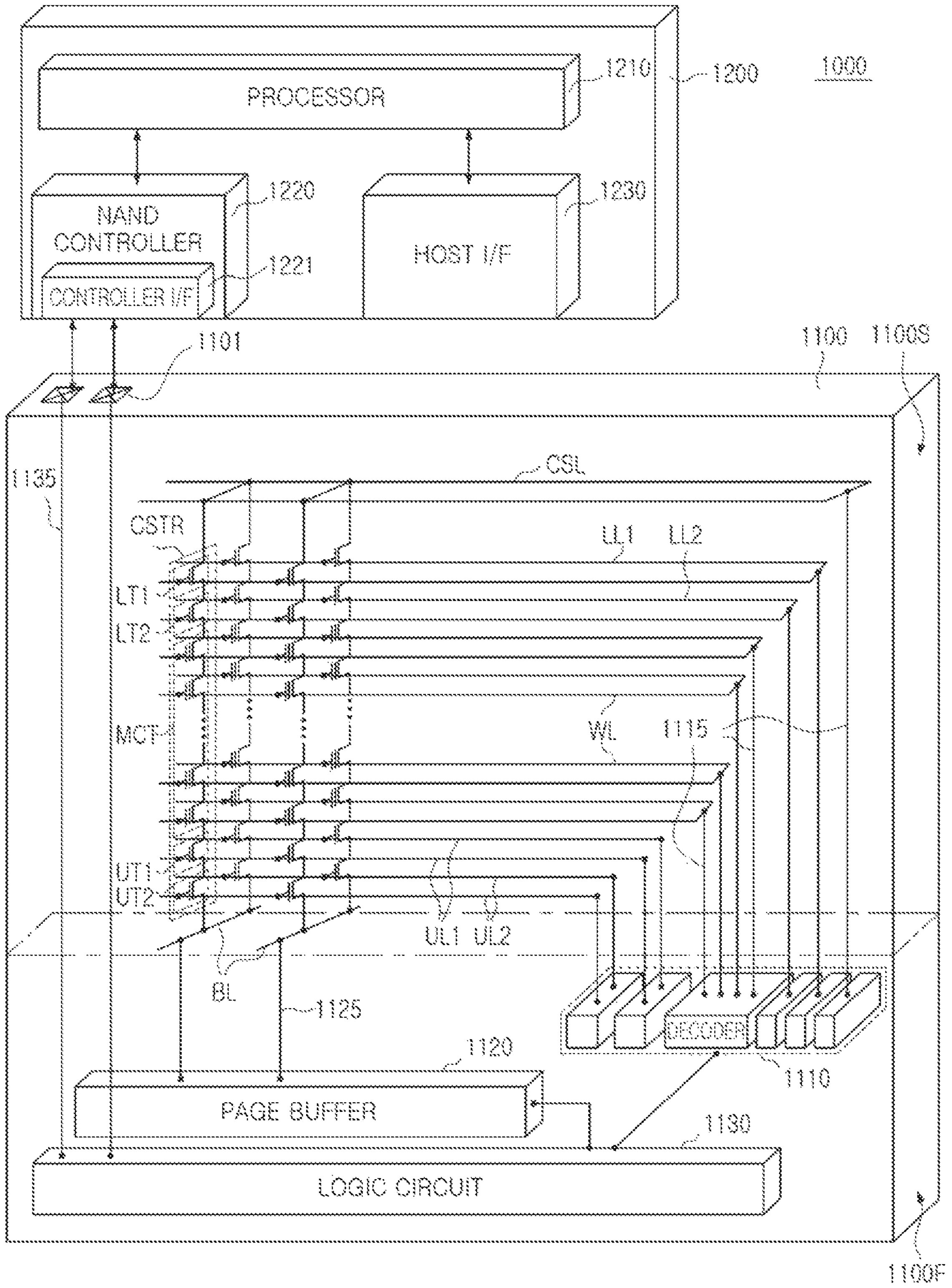
FIG. 7 is a diagram illustrating a data storage system including a semiconductor device according to an example embodiment.

FIG. 7 is a diagram illustrating a data storage system including a semiconductor device according to an example embodiment.

Referring to FIG. 7, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD), a universal serial bus (USB), a computing system, a medical device, or a communication device, including one or a plurality of semiconductor devices 1100.

The semiconductor device 1100 may be a nonvolatile memory device, for example, the NAND flash memory device described above with reference to FIGS. 1 to 6K. The semiconductor device 1100 may include a first semiconductor structure 1100F and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using the GIDL phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the inside of the first semiconductor structure 1100F to the second semiconductor structure 1100S. The bit lines BL may be electrically connected to the page buffer 1120 through second connection interconnections 1125 extending from the inside of the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection interconnection 1135 extending from the inside of the first semiconductor structure 1100F to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 that processes communication with the semiconductor device 1100. Through the NAND interface 1221, a control command for controlling the semiconductor device 1100, data to be written to the memory cell transistors MCT of the semiconductor device 1100, data to be read from the memory cell transistors MCT, and the like may be transmitted. The host interface 1230 may provide a communication function between the data storage system 1000 and an external host. When receiving a control command from an external host through the host interface 1230, the processor 1210 may control the semiconductor device 1100 in response to the control command.

Figure 8:
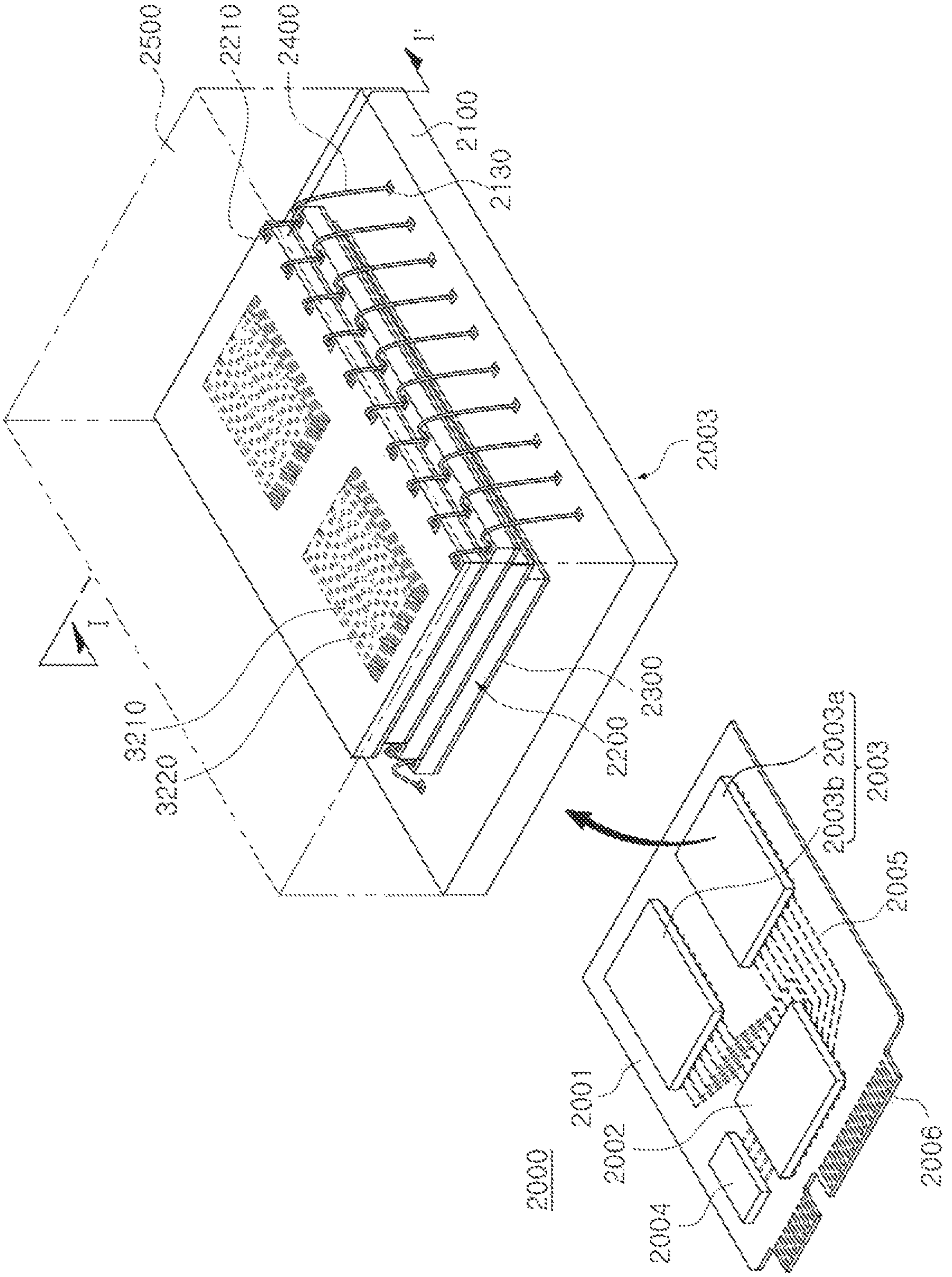
FIG. 8 is a diagram of a data storage system including a semiconductor device according to an example embodiment.

FIG. 8 is a diagram of a data storage system including a semiconductor device according to an example embodiment.

Referring to FIG. 8, a data storage system 2000 according to an example embodiment of the present disclosure may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of the interfaces such as a universal serial bus (USB), peripheral component interconnect express (PCI-Express), Serial advanced technology attachment (SATA), an M-Phy for universal flash storage (UFS), and the like. In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the data storage system 2000.

The DRAM 2004 may be a buffer memory for reducing a speed difference between the semiconductor package 2003 as a data storage space and an external host. The DRAM 2004 included in the data storage system 2000 may also operate as a kind of cache memory, and may provide a space for temporarily storing data in a control operation for the semiconductor package 2003. For example, when the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 disposed on lower surfaces of the semiconductor chips 2200, respectively, a connection structure 2400 electrically connecting the semiconductor chips 2200 and the package substrate 2100, and a molded layer 2500 covering the semiconductor chips 2200 and the connection structure 2400 on the package substrate 2100.

The package substrate 2100 may be a printed circuit board including upper package pads 2130. Each semiconductor chip 2200 may include an input/output pad 2210. The input/output pad 2210 may correspond to the input/output pad 1101 of FIG. 7 and may be a region including the input/output pad 300 of FIG. 2A. Each of the semiconductor chips 2200 may include gate stack structures 3210 and channel structures 3220. Each of the semiconductor chips 2200 may include the semiconductor device described above with reference to FIGS. 1 to 6K.

In example embodiments, the connection structure 2400 may be a bonding wire electrically connecting the input/output pad 2210 and the upper package pads 2130. Accordingly, in each of the first and second semiconductor packages 2003*a* and 2003*b*, the semiconductor chips 2200 may be electrically connected to each other by a bonding wire method, and may be electrically connected to the upper package pads 2130 of the package substrate 2100. According to example embodiments, in each of the first and second semiconductor packages 2003*a* and 2003*b*, the semiconductor chips 2200 may also be electrically connected to each other by a connection structure including a through silicon via (TSV) instead of the connection structure 2400 of the bonding wire method.

In example embodiments, the controller 2002 and the semiconductor chips 2200 may be included in one package. In an example embodiment, the controller 2002 and the semiconductor chips 2200 may be mounted on a separate interposer substrate different from the main board 2001, and the controller 2002 and the semiconductor chips 2200 may be connected to each other by interconnections formed on the interposer substrate.

Figure 9:
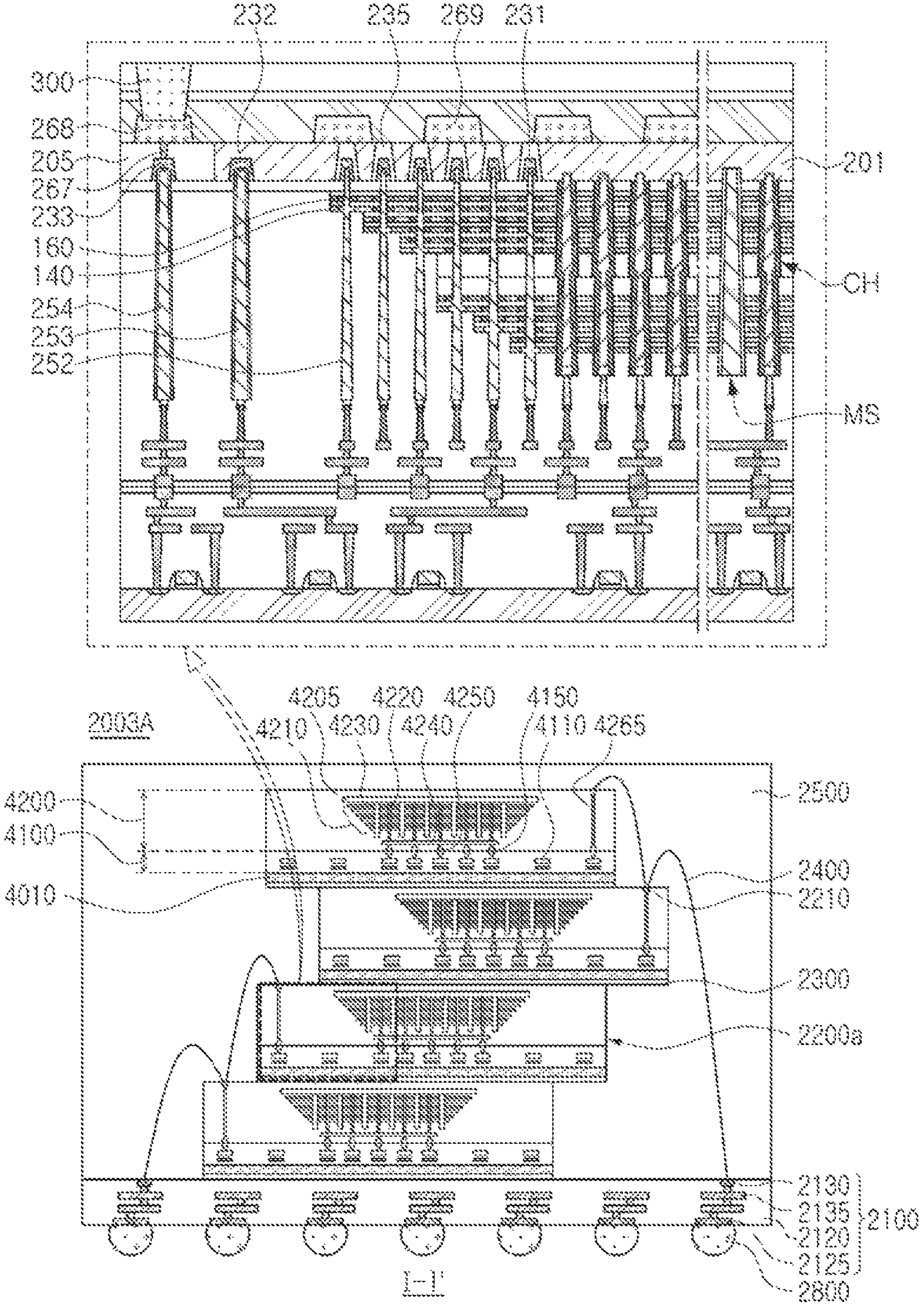
FIG. 9 is a cross-sectional view illustrating a semiconductor package according to an example embodiment.

FIG. 9 is a cross-sectional view illustrating a semiconductor package according to an example embodiment. FIG. 9 illustrates an example embodiment of the semiconductor package 2003 of FIG. 8, and conceptually illustrates a region taken along line I-I' of the semiconductor package 2003 of FIG. 8.

Referring to FIG. 9, in the semiconductor package 2003, the package substrate 2100 may be a printed circuit board. The package substrate 2100 may include a package substrate body 2120, upper package pads 2130 (see FIG. 8) disposed on an upper surface of the package substrate body 2120, lower pads 2125 disposed on or exposed through the lower surface of the package substrate body 2120, and internal interconnections 2135 electrically connecting the upper package pads 2130 and the lower pads 2125 inside the package substrate body 2120. The upper package pads 2130 may be electrically connected to the connection structures 2400. The lower pads 2125 may be connected to the interconnection patterns 2005 of the main board 2010 of the data storage system 2000 as illustrated in FIG. 8 through conductive connection portions 2800.

Each of the semiconductor chips 2200 may include a semiconductor substrate 3010, and a first semiconductor structure 3100 and a second semiconductor structure 3200 that are sequentially stacked on the semiconductor substrate 3010. The first semiconductor structure 3100 may include a peripheral circuit region including peripheral interconnections 3110. The second semiconductor structure 3200 may include a common source line 3205, a gate stack structure 3210 on the common source line 3205, channel structures 3220 and separation regions 3230 passing through the gate stack structure 3210, bit lines 3240 electrically connected to the memory channel structures 3220, and contact plugs 3235 electrically connected to the word lines WL of the gate stack structure 3210 (see FIG. 7). As described above with reference to FIGS. 1 to 6K, in each of the semiconductor chips 2200, the gate contact plugs 252 may be electrically connected to the first conductive pads 231 respectively disposed in the insulating patterns 235, and the first conductive pads 231 may be disposed to be spaced apart from the second substrate 201 by the insulating patterns 235.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may be disposed outside the gate stack structure 3210, and may be further disposed to pass through the gate stack structure 3210. Each of the semiconductor chips 2200 may further include an input/output pad 2210 (refer to FIG. 8) electrically connected to the peripheral interconnections 3110 of the first semiconductor structure 3100, and the input/output pad As set forth above, according to an example embodiment, insulation patterns in the second substrate may be disposed, and the second substrate and the gate contact plugs are spaced apart by the insulating patterns. Accordingly, a semiconductor device having improved electrical characteristics and reliability and a data storage system including the same may be provided.

Although the disclosure been described in connection with some embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A semiconductor device comprising:

a first semiconductor structure comprising a first substrate, circuit elements provided on the first substrate, and a lower interconnection structure connected to the circuit elements; and a second semiconductor structure provided on the first semiconductor structure and connected to the first semiconductor structure, wherein the second semiconductor structure comprises:

a second substrate comprising a first region and a second region;

insulating patterns provided in the second substrate;

gate electrodes provided between the second substrate and the first semiconductor structure and spaced apart from each other in a first direction that is perpendicular to a lower surface of the second substrate;

a channel structure provided below the first region of the second substrate, penetrating through the gate electrodes and extending in the first direction, the channel structure comprising a channel layer;

gate contact plugs passing through the gate electrodes, extending in the first direction, extending into the insulating patterns respectively, and spaced apart from the second substrate by the insulating patterns; and a source contact plug connected to the second substrate and extending from a level lower than a lowermost gate electrode closest to the first semiconductor structure, among the gate electrodes, to at least an inside of the second substrate.

2. The semiconductor device of claim 1, further comprising, a peripheral contact plug provided in an outer area of the second substrate, and extending from a level lower than the lowermost gate electrode closest to the first semiconductor structure to a level higher than the lower surface of the second substrate;

a first conductive pattern provided on the peripheral contact plug and connected to the peripheral contact plug; and second conductive patterns provided on the second substrate and connected to the second substrate, wherein the second conductive patterns contact an upper surface of the second substrate, and wherein the second conductive patterns are provided on a substantially same level as the first conductive pattern.

3. The semiconductor device of claim 1, wherein the insulating patterns penetrate through the second substrate, and wherein side surfaces of the insulating patterns contact the second substrate.

4. The semiconductor device of claim 1, wherein the second substrate covers an upper surface and a side surface of each of the insulating patterns.

5. The semiconductor device of claim 1, further comprising conductive pads provided in the insulating patterns, wherein the insulating patterns cover an upper surface and a side surface of each of the conductive pads, and wherein the gate contact plugs contact the conductive pads.

6. The semiconductor device of claim 1, wherein the gate contact plugs pass through pad regions of the gate electrodes and are connected to side surfaces of the pad regions of the gate electrodes; and wherein the pad regions of the gate electrodes are provided below the second region of the second substrate.

7. The semiconductor device of claim 1, wherein a first gate contact plug of the gate contact plugs and a first gate electrode of the gate electrodes are connected to each other, wherein the first gate contact plug passes through a pad region of the first gate electrode and is connected to a side surface of the pad region of the first gate electrode, wherein the gate electrodes comprise intermediate gate electrodes positioned between the first gate electrode and the second substrate, and wherein the first gate contact plug passes through the intermediate gate electrodes and is spaced apart from the intermediate gate electrodes.

8. The semiconductor device of claim 1, wherein the channel layer comprises a protruding portion extending into and contacting the second substrate, and wherein the channel structure further comprises a gate dielectric layer provided between the gate electrodes and the channel layer.

9. A semiconductor device comprising:

a substrate comprising a first region and a second region;

insulating patterns in the substrate;

gate electrodes provided below the substrate and spaced apart from each other in a first direction that is perpendicular to a lower surface of the substrate, the gate electrodes comprising pad regions arranged in a step shape below the second region;

gate contact plugs passing through the pad regions of the gate electrodes, extending in the first direction, and vertically overlapping the insulating patterns; and a peripheral contact plug provided in an outer area of the substrate and extending from a level lower than a level of a lowermost gate electrode of the gate electrodes to a level higher than the lower surface of the substrate; and conductive patterns including a first conductive pattern provided on and connected to the peripheral contact plug, and second conductive patterns provided on and connected to the substrate.

10. The semiconductor device of claim 9, further comprising first pads provided in the insulating patterns, spaced apart from the substrate by the insulating patterns, and connected to the gate contact plugs respectively.

11. The semiconductor device of claim 10, further comprising:

a source contact plug extending from a level lower than the level of the lowermost gate electrode of the gate electrodes to an inside of the substrate, and connected to the substrate; and a second pad contacting an upper portion of the source contact plug and provided in the substrate, wherein at least a side surface of the second pad contacts the substrate.

12. The semiconductor device of claim 11, further comprising a third pad contacting an upper portion of the peripheral contact plug and provided on the outer area of the substrate, wherein a thickness of the third pad is less than a thickness of the substrate, and wherein at least a portion of the third pad is provided on a substantially same level as a level of a portion of the substrate.

13. The semiconductor device of claim 12, further comprising:

a peripheral contact via provided on the third pad and connected to the third pad, wherein the first conductive pattern is provided on the peripheral contact via and connected to the peripheral contact via.

14. The semiconductor device of claim 13, wherein the first conductive pattern and the second conductive patterns are provided on a substantially same level.

15. The semiconductor device of claim 13, further comprising via patterns provided between the second conductive patterns and the substrate.

16. The semiconductor device of claim 13, wherein the substrate comprises a doped polysilicon layer.

17. The semiconductor device of claim 13, further comprising:

a first upper insulating layer covering the first conductive pattern and the second conductive patterns;

a second upper insulating layer provided on the first upper insulating layer;

a protective layer provided on the second upper insulating layer; and an input/output pad passing through the first upper insulating layer, the second upper insulating layer, and the protective layer, in the outer area of the substrate, wherein the input/output pad contacts the first conductive pattern.

18. The semiconductor device of claim 9, wherein the gate contact plugs penetrate through the pad regions of the gate electrodes and are connected to side surfaces of the pad regions of the gate electrodes.

19. A data storage system comprising:

a first semiconductor structure comprising a first substrate, circuit elements provided on the first substrate, and a lower interconnection structure connected to the circuit elements;

a semiconductor storage device comprising a second semiconductor structure provided on the first semiconductor structure and connected to the first semiconductor structure, and an input/output pad connected to the circuit elements; and a controller connected to the semiconductor storage device through the input/output pad, and configured to control the semiconductor storage device, wherein the second semiconductor structure comprises:

a second substrate comprising a first region and a second region;

insulating patterns provided in the second substrate;

gate electrodes provided between the second substrate and the first semiconductor structure and spaced apart from each other in a first direction that is perpendicular to a lower surface of the second substrate;

a channel structure provided below the first region of the second substrate, penetrating through the gate electrodes and extending in the first direction, the channel structure comprising a channel layer;

gate contact plugs passing through the gate electrodes, extending in the first direction, extending into the insulating patterns respectively, and spaced apart from the second substrate by the insulating patterns; and a source contact plug connected to the second substrate and extending from a level lower than a level of a lowermost gate electrode closest to the first semiconductor structure, among the gate electrodes, to an inside of the second substrate.

20. The data storage system of claim 19, wherein the gate contact plugs penetrate through pad regions of the gate electrodes and are connected to side surfaces of the pad regions of the gate electrodes.

* * * * *